(12) United States Patent
Ka et al.

(10) Patent No.: US 11,751,443 B2
(45) Date of Patent: Sep. 5, 2023

(54) ORGANIC LIGHT EMITTING DIODE DISPLAY

(71) Applicant: Samsung Display Co., Ltd., Yongin-si (KR)

(72) Inventors: Ji-Hyun Ka, Seongnam-si (KR); Tae Geun Kim, Seoul (KR); Ki Myeong Eom, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 92 days.

(21) Appl. No.: 16/689,860

(22) Filed: Nov. 20, 2019

(65) Prior Publication Data

US 2020/0161407 A1 May 21, 2020

(30) Foreign Application Priority Data

Nov. 21, 2018 (KR) .................. 10-2018-0144609

(51) Int. Cl.
*H10K 59/131* (2023.01)
*G09G 3/3225* (2016.01)
(Continued)

(52) U.S. Cl.
CPC ......... *H10K 59/131* (2023.02); *G09G 3/3225* (2013.01); *H10K 59/1213* (2023.02);
(Continued)

(58) Field of Classification Search
CPC ............. H01L 27/3262; H01L 27/3276; H01L 27/3265; H01L 27/124; H01L 27/3246;
(Continued)

(56) References Cited

U.S. PATENT DOCUMENTS 9,117,783 B2  8/2015  Jin
9,608,050 B2  3/2017  Jin
(Continued)

FOREIGN PATENT DOCUMENTS

KR  100543013  1/2006
KR  20140140967  12/2014
(Continued)

*Primary Examiner* — Samuel A Gebremariam
*Assistant Examiner* — Jonas T Beardsley
(74) *Attorney, Agent, or Firm* — CANTOR COLBURN LLP

(57) ABSTRACT

An exemplary embodiment provides an organic light emitting diode display including a substrate, a bridge electrode disposed on the substrate, a buffer layer which covers the bridge electrode, a semiconductor layer disposed on the buffer layer, a first gate insulating layer which covers the semiconductor layer in a plan view, a first gate conductor disposed on the first gate insulating layer and which includes a first gate electrode, a second gate insulating layer which covers the first gate conductor, a second gate conductor disposed on the second gate insulating layer, an interlayer-insulating layer which covers the second gate conductor, and a data line disposed on the interlayer-insulating layer. The first gate electrode is directly connected to the bridge electrode, the semiconductor layer is electrically connected to the bridge electrode, and a capacitance exists between the data line and the bridge electrode.

15 Claims, 16 Drawing Sheets

(51) Int. Cl.
*H10K 59/121* (2023.01)
*H01L 27/12* (2006.01)

(52) U.S. Cl.
CPC . *H10K 59/1216* (2023.02); *G09G 2300/0426* (2013.01); *G09G 2300/08* (2013.01); *G09G 2320/0209* (2013.01); *H01L 27/1214* (2013.01)

(58) Field of Classification Search
CPC . H10K 59/1213; H10K 59/131; H10K 59/123
See application file for complete search history.

(56) References Cited

U.S. PATENT DOCUMENTS

| | | | |
|---|---|---|---|
| 10,522,604 | B2 | 12/2019 | Jin |
| 2016/0225883 | A1 | 8/2016 | Hong et al. |
| 2016/0254496 | A1 | 9/2016 | Xu et al. |
| 2018/0062105 | A1* | 3/2018 | Lius ................ H01L 27/3262 |
| 2019/0027092 | A1* | 1/2019 | Matsueda .......... H01L 27/3265 |
| 2019/0148477 | A1* | 5/2019 | Park ................. H01L 27/3262 257/40 |

FOREIGN PATENT DOCUMENTS

| | | |
|---|---|---|
| KR | 1020150028055 | 3/2015 |
| KR | 1020150101028 | 9/2015 |
| KR | 1020160086503 | 7/2016 |
| KR | 101739499 | 5/2017 |
| KR | 1020180026602 | 3/2018 |

* cited by examiner

ORGANIC LIGHT EMITTING DIODE DISPLAY

CROSS-REFERENCE TO RELATED APPLICATION

This application claims priority to Korean Patent Application No. 10-2018-0144609, filed on Nov. 21, 2018, and all the benefits accruing therefrom under 35 U.S.C. § 119, the content of which in its entirety is herein incorporated by reference.

BACKGROUND

(a) Technical Field

The present disclosure relates to an organic light emitting diode display.

(b) Description of the Related Art

An Organic light emitting diode ("OLED") display has received much attention as a display device for displaying images.

The OLED display has a self-emission characteristic, eliminating the necessity for a light source, unlike a liquid crystal display ("LCD") device, and thus can be fabricated to be thinner and lighter. Further, the OLED display has high quality characteristics such as low power consumption, high luminance, high response speed, and the like.

In general, the OLED display includes a substrate, a plurality of transistors disposed on the substrate, a plurality of insulating layers disposed between wires constituting the transistors, and light emitting elements connected to the transistors.

In many cases, the OLED display includes many components included in one pixel as compared with a liquid crystal display device, and wires are concentrated in a pixel area of a small size as more devices require high resolution.

SUMMARY

Exemplary embodiments have been made in an effort to provide an organic light emitting display in which cross-talk generated between a data line and a driving connector adjacent thereto is reduced.

An exemplary embodiment provides an organic light emitting diode display including a substrate, a bridge electrode disposed on the substrate, a buffer layer which covers the bridge electrode, a semiconductor layer disposed on the buffer layer, a first gate insulating layer which covers the semiconductor layer, a first gate conductor disposed on the first gate insulating layer and which includes a first gate electrode, a second gate insulating layer which covers the first gate conductor, a second gate conductor disposed on the second gate insulating layer, an interlayer-insulating layer which covers the second gate conductor, and a data line disposed on the interlayer-insulating layer, where the first gate electrode is physically connected to the bridge electrode, the semiconductor layer is electrically connected to the bridge electrode, and a capacitance exists between the data line and the bridge electrode.

In an exemplary embodiment, the semiconductor layer may include a channel region of the driving transistor and a drain region of a third transistor, the channel region of the driving transistor may overlap the first gate electrode, and the drain region of the third transistor may be electrically connected to the bridge electrode.

In an exemplary embodiment, the organic light emitting diode display may further include a first gate connector disposed on a same layer as the first gate electrode.

In an exemplary embodiment, the first gate connector may be physically connected to the bridge electrode through a first contact hole formed in the first gate insulating layer and the buffer layer, and may be physically connected to the semiconductor layer through a second contact hole formed in the first gate insulating layer.

In an exemplary embodiment, the second gate conductor may include a storage electrode, and the storage electrode may overlap the first gate electrode with the second gate insulating layer interposed therebetween to constitute a storage capacitor.

In an exemplary embodiment, the organic light emitting diode display may further include a driving connector disposed on a same layer as the data line.

In an exemplary embodiment, the first gate connector may be physically connected to the bridge electrode through a first contact hole formed in the first gate insulating layer and the buffer layer, and may be physically connected to the driving connector through a second contact hole formed in the second gate insulating layer and the interlayer-insulating layer, and the driving connector may be physically connected to the semiconductor layer through a third contact hole formed in the interlayer-insulating layer, the first gate insulating layer, and the second gate insulating layer.

In an exemplary embodiment, the organic light emitting diode display may further include a third gate insulating layer which covers the second gate conductor, a third gate conductor disposed on the third gate insulating layer, and a driving voltage line disposed on the interlayer-insulating layer, and the driving voltage line may be disposed to overlap the bridge electrode, and an interlayer-insulating layer covers the third gate conductor.

In an exemplary embodiment, the semiconductor layer may include a channel region of the driving transistor and a drain region of the third transistor, the channel region of the driving transistor may overlap the first gate electrode, and the drain region of the third transistor may be electrically connected to the bridge electrode.

In an exemplary embodiment, the second gate conductor may include a storage electrode, and the storage electrode may overlap the first gate electrode with the second gate insulating layer interposed therebetween to constitute a storage capacitor.

In an exemplary embodiment, the organic light emitting diode display may further include a lower gate connector disposed on a same layer as the first gate electrode.

In an exemplary embodiment, the lower gate connector may be physically connected to the bridge electrode through a first contact hole formed in the lower gate insulating layer and the buffer layer, and may be physically connected to the semiconductor layer through a second contact hole formed in the first gate insulating layer.

In an exemplary embodiment, the organic light emitting diode display may further include an upper gate connector disposed on a same layer as the third gate conductor.

In an exemplary embodiment, the upper gate connector may be physically connected to the semiconductor layer through a first contact hole formed in the first gate insulating layer, the second gate insulating layer, and the third gate insulating layer, and may be physically connected to the bridge electrode through a second contact hole formed in the buffer layer, the first gate insulating layer, the second gate insulating layer, and the third gate insulating layer.

In an exemplary embodiment, the organic light emitting diode display may further include an upper gate connector disposed on a same layer as the third gate conductor, and the lower gate connector may be physically connected to the bridge electrodes through a first contact hole formed in in the buffer layer and the first gate insulating layer, and may be physically connected to the upper gate connector through a second contact hole formed in the second gate insulating layer and the third gate insulating layer. The upper gate connector may be physically connected to the semiconductor through a third contact hole formed in the first gate insulating layer, the second gate insulating layer, and the third gate insulating layer.

An exemplary embodiment provides an organic light emitting diode display including a substrate, a scan line disposed on the substrate, a data line disposed and which crosses the scan line, a driving voltage line disposed in parallel with the data line and which overlaps a plurality of transistors in a plan view, a driving transistor which has a first gate electrode and a first electrode connected to the driving voltage line, an organic light emitting diode connected to the driving transistor, a second transistor connected to the scan line, the data line, and the first electrode of the driving transistor, and a third transistor which includes a third gate electrode connected to the scan line and a second electrode connected to the first gate electrode. The first gate electrode of the driving transistor and the second electrode of the third transistor are connected through a bridge electrode, and the driving voltage line overlaps the bridge electrode in the plan view.

In an exemplary embodiment, the organic light emitting diode display may further include a first storage electrode connected to the driving voltage line and a second storage electrode which includes the first gate electrode, and the first storage electrode and the second storage electrode may overlap each other in the plan view and constitute a storage capacitor.

In an exemplary embodiment, the organic light emitting diode display may further include an upper gate connector which overlaps the bridge electrode and the second electrode of the third transistor in the plan view, and the upper gate connector may be physically connected to the bridge electrode and the second electrode of the third transistor through a contact hole.

In an exemplary embodiment, the organic light emitting diode display may further include a lower gate connector which overlaps the bridge electrode and the second electrode of the third transistor in the plan view, and the lower gate connector may be physically connected to the bridge electrode and the second electrode of the third transistor through a contact hole.

In an exemplary embodiment, the driving voltage line may not be overlapped with the bridge electrode in the plan view.

According to the exemplary embodiments, the gate electrode of the first transistor and the drain region of the third transistor may be connected to each other using a bridge electrode instead of the driving connector adjacent to the data line. In addition, the parasitic capacitance existing between the data line and the driving connector or the bridge electrode may be reduced by forming only a part of the driving connector and using the bridge electrode. That is, it is possible to provide an organic light emitting diode display in which crosstalk generated between the data line and the neighboring driving connector or the bridge electrode is reduced.

DETAILED DESCRIPTION

Figure 1:
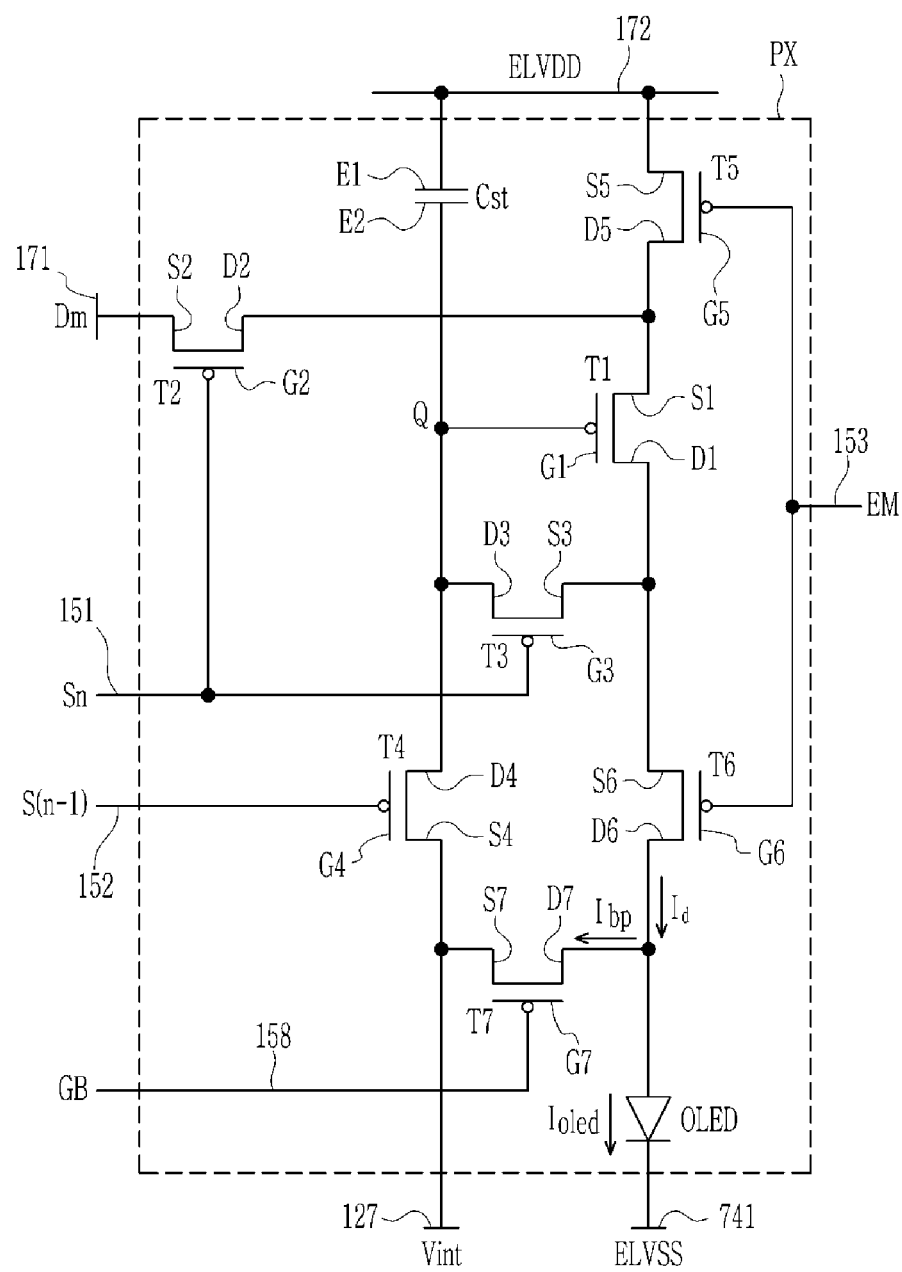
FIG. 1 illustrates an equivalent circuit diagram of an exemplary embodiment of one pixel of an organic light emitting diode display according to the invention.

The invention will be described more fully hereinafter with reference to the accompanying drawings, in which exemplary embodiments are shown. As those skilled in the art would realize, the described embodiments may be modified in various different ways, all without departing from the spirit or scope of the invention.

To clearly describe the invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, and does not necessarily mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

Hereinafter, an organic light emitting diode display according to an exemplary embodiment will be described with reference to FIG. 1.

FIG. 1 illustrates an equivalent circuit diagram of an exemplary embodiment of one pixel of an organic light emitting diode display according to the invention.

FIG. 1 illustrates the organic light emitting diode display in which a crosstalk phenomenon is reduced as compared with a structure including a driving connector that is disposed on the same layer as a data line, by forming a bridge electrode 31 (see FIG. 2 to FIG. 16) for connecting a driving gate connector Q at a lower portion of a buffer layer or forming a driving connector at some regions. The main features will be described in detail below with reference to FIG. 2 to FIG. 16, and hereinafter, a general organic light emitting display will be described.

Referring to FIG. 1, one pixel PX of the organic light emitting diode display includes a plurality of transistors T1, T2, T3, T4, T5, T6, and T7 connected to a plurality of signal lines 127, 151, 152, 153, 158, 171, 172, and 741, a storage capacitor Cst, and an organic light emitting diode OLED.

The organic light emitting diode display includes a display area for displaying an image, and such pixels PX are arranged in various ways (e.g., a matrix) in the display area.

The transistors T1, T2, T3, T4, T5, T6, and T7 include a driving transistor T1 switching transistors (i.e., a second transistor T2 and a third transistor T3) connected with a scan line 151, and other transistors (hereinafter referred to as "compensation transistors") for performing an operation required to operate the organic light emitting diode OLED. These compensation transistors T4, T5, T6, and T7 may include a fourth transistor T4, a fifth transistor T5, a sixth transistor T6, and a seventh transistor T7. The plurality of signal lines 127, 151, 152, 153, 158, 171, 172, and 741 may include the scan line 151, a previous-stage scan line 152, a light emission control line 153, a bypass control line 158, a data line 171, a driving voltage line 172, an initialization voltage line 127, and a common voltage line 741. The bypass control line 158 may be a portion of the previous-stage scan line 152, or may be electrically connected to the previous-stage scan line 152.

The scan line 151 is connected to a gate driver (not illustrated) to transfer a scan signal Sn to the second transistor T2 and the third transistor T3. The previous-stage scan line 152 is connected to the gate driver, and transfers a previous-stage scan signal S(n−1) to the fourth transistor T4. The light emission control line 153 is connected to an emission controller (not illustrated), and transfers a light emission control signal EM to the fifth transistor T5 and the sixth transistor T6 for controlling a light emission time of the organic light emitting diode OLED. The bypass control line 158 transfers a bypass signal GB to the seventh transistor T7.

The data line 171 is a wire for transferring a data voltage Dm generated by a data driver (not illustrated), and a luminance of the organic light emitting diode OLED (also referred to as "an organic light emitting element") that emits light varies depending on the data voltage Dm. The driving voltage line 172 applies a driving voltage ELVDD, the initialization voltage line 127 transfers a initialization voltage Vint for initializing the driving transistor T1, and the common voltage line 741 applies a common voltage ELVSS. Constant voltages are respectively applied to the driving voltage line 172, the initialization voltage line 127, and the common voltage line 741.

First, the driving transistor T1 adjusts the magnitude of a driving current Id that is outputted depending on the data voltage Dm applied to the driving transistor T1, and the driving current Id outputted therefrom is applied to the organic light emitting diode OLED so as to adjust the brightness of the organic light emitting diode OLED depending on the data voltage Dm. For this purpose, a first electrode S1 of the driving transistor T1 is disposed to receive the driving voltage ELVDD, and is connected to the driving voltage line 172 through the fifth transistor T5. In addition, the first electrode S1 of the driving transistor T1 is also connected to a second electrode D2 of the second transistor T2 so that the data voltage Dm is also applied the first electrode S1. A second electrode D1 of the driving transistor T1, which is one of output side electrodes, is disposed to output the driving current Id toward the organic light emitting electrode OLED, and is connected to an anode of the organic light emitting diode OLED through the sixth transistor T6. A gate electrode G1 of the driving transistor T1 is connected to an electrode of the storage capacitor Cst, which is a second storage electrode E2. Accordingly, a voltage of the gate electrode G1 varies depending on a voltage stored in the storage capacitor Cst, and thus the driving current Id outputted by the driving transistor T1 varies depending on the voltage stored in the storage capacitor Cst.

The second transistor T2 accepts the data voltage Dm into the pixel PX. A gate electrode G2 of the second transistor T2 is connected to the first scan line 151, and a first electrode S2 of the second transistor T2 is connected to the data line 171. The second electrode D2 of the second transistor T2 is connected to the first electrode S1 of the driving transistor T1. When the second transistor T2 is turned on depending on the scan signal Sn transferred through the scan line 151, the data voltage Dm transferred through the data line 171 is transferred to the first electrode S1 of the driving transistor T1.

The third transistor T3 transfers a compensated voltage Dm+Vth to the second storage electrode E2 of the storage capacitor Cst. Here, the compensated voltage Dm+Vth is a voltage applied to the gate electrode G1 when the data voltage Dm is applied to the first electrode S1. The amount of the compensated voltage Dm+Vth corresponds to the sum of the data voltage Dm and the threshold voltage Vth of the driving transistor T1. A gate electrode G3 of the third transistor T3 is connected to the scan line 151, and a first electrode S3 of third transistor T3 is connected to the second electrode D1 of the driving transistor T1. A second electrode D3 of the third transistor T3 is connected to the second storage electrode E2 of the storage capacitor Cst and the gate electrode G1 of the driving transistor T1.

The third transistor T3 is turned on depending on the scan signal Sn transferred through the scan line 151 and connects the gate electrode G1 and the second electrode D1 of the driving transistor T1 and connects the second electrode D1 of the driving transistor T1 and the second storage electrode E2 of the storage capacitor Cst when the third transistor T3 is turned on.

The fourth transistor T4 initializes the gate electrode G1 of the driving transistor T1 and the second storage electrode E2 of the storage capacitor Cst. A gate electrode G4 is connected to the previous-stage scan line 152, and a first electrode S4 of the fourth transistor T4 is connected to the initialization voltage line 127. A second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 transfers the initialization voltage Vint to the gate electrode G1 of the driving transistor T1 and the second storage electrode E2 of the storage capacitor Cst depending on the previous-stage scan signal S(n−1) transferred through the previous-stage scan line 152. Thus, the voltage of the gate electrode G1 of the driving transistor T1 and the second storage electrode E2 of the storage capacitor Cst is initialized. The initialization voltage Vint may be a voltage that has a low voltage value to turn on the driving transistor T1.

The fifth transistor T5 transfers the driving voltage ELVDD to the driving transistor T1. A gate electrode G5 of the fifth transistor T5 is connected to the light emission control line 153, and a first electrode S5 of the fifth transistor T5 is connected to the driving voltage line 172. A second electrode D5 of the fifth transistor T5 is connected to the first electrode S1 of the driving transistor T1.

The sixth transistor T6 transfers the driving current Id outputted from the driving transistor T1 to the organic light emitting diode OLED. A gate electrode G6 of the sixth transistor T6 is connected to the light emission control line 153, and a first electrode S6 of the sixth transistor T6 is connected to the second electrode D1 of the driving transistor T1. A second electrode D6 of the sixth transistor T6 is connected to the anode of the light emitting diode OLED.

The fifth transistor T5 and the sixth transistor T6 are simultaneously turned on depending on the light emission control signal EM transferred through the light emission control line 153, and when the driving voltage ELVDD is applied to the first electrode S1 of the driving transistor T1 through the fifth transistor T5, the driving transistor T1 outputs the driving current Id depending on the voltage of the gate electrode G1 of the driving transistor T1 (i.e., the voltage of the second storage electrode E2 of the storage capacitor Cst). The outputted driving current Id is transferred to the organic light emitting diode OLED through the sixth transistor T6. The organic light emitting diode OLED emits light as a current Ioled flows through the organic light emitting diode OLED. A part of the driving current Id (i.e., bypass current Ibp) flows to a second electrode D7 of the seventh transistor T7 and the remaining current of the driving current Id (i.e., current Ioled) flows to the anode of the organic light emitting diode OLED.

The seventh transistor T7 initializes the anode of the organic light emitting diode OLED. A gate electrode G7 of the seventh transistor T7 is connected to the bypass control line 158, the second electrode D7 of the seventh transistor T7 is connected to the anode of the organic light emitting diode OLED, and a first electrode S7 of the seventh transistor T7 is connected to the initialization voltage line 127. In an exemplary embodiment, the bypass control line 158 may be connected to the previous-stage scan line 152, and a signal having the same timing as the scan signal S(n−1) may be applied to the bypass control line 158 as a bypass signal GB. In another exemplary embodiment, the bypass control line 158 may not be connected to the previous-stage scan line 152, and may transfer a separate signal (i.e., bypass signal GB) from the previous-stage scan signal S(n−1). When the seventh transistor T7 turns on depending on the bypass signal GB, the initialization voltage Vint is applied to the anode of the organic light emitting diode OLED and the organic light emitting diode OLED is initialized.

A first storage electrode E1 of the storage capacitor Cst is connected to the driving voltage line 172. The second storage electrode E2 is connected to the gate electrode G1 of the driving transistor T1, the second electrode D3 of the third transistor T3, and the second electrode D4 of the fourth transistor T4. As a result, the second storage electrode E2 determines the voltage of the gate electrode G1 of the driving transistor T1, and receives the data voltage Dm through the second electrode D3 of the third transistor T3 or the initialization voltage Vint through the second electrode D4 of the fourth transistor T4.

Meanwhile, the anode of the organic light emitting diode OLED is connected to the second electrode D6 of the sixth transistor T6 and the second electrode D7 of the seventh transistor T7, and the cathode is connected to the common voltage line 741 which transfers the common voltage ELVSS.

In the exemplary embodiment of FIG. 1, the pixel circuit includes seven transistors T1 to T7 and one capacitor Cst, but the invention is not limited thereto. The numbers of the transistors and the capacitors and connections therebetween may be variously modified.

Hereinafter, an operation of one pixel of an organic light emitting diode display according to an exemplary embodiment will be described with reference to FIG. 1.

The previous-stage scan signal S(n−1) of a low level is supplied to the pixel PX through the previous-stage scan line 152 during an initialization period. Then, the fourth transistor T4 receiving the previous-stage scan signal S(n−1) of the low level is turned on to apply the initialization voltage Vint to the gate electrode G1 of the driving transistor T1 and the second storage electrode E2 of the storage capacitor Cst through the fourth transistor T4. As a result, the driving transistor T1 and the storage capacitor Cst are initialized. The initialization voltage Vint has a low value to turn on the driving transistor T1.

During the initialization period, a low level bypass signal GB is also applied to the seventh transistor T7. The seventh transistor T7 receiving it is turned on to apply the initialization voltage Vint to the anode of the organic light emitting diode OLED through the seventh transistor T7. As a result, the anode of the organic light emitting diode OLED is also initialized.

Then, the scan signal Sn of a low level is applied to the pixel PX through the scan line 151 during a data writing period. The second transistor T2 and the third transistor T3 are turned on by the scan signal Sn of the low level. The scan signal Sn may include a plurality of low level signals for one frame.

When the second transistor T2 is turned on, the data voltage Dm is inputted into the first electrode S1 of the driving transistor T1 through the second transistor T2.

In addition, the third transistor T3 is turned on during the data writing period, and as a result, the second electrode D1 of the driving transistor T1 is electrically connected to the gate electrode G1 and the second storage electrode E2 of the storage capacitor Cst. The gate electrode G1 and the second electrode D1 of the driving transistor T1 are diode-connected. In addition, the driving transistor T1 is turned on because a low voltage (e.g., the initialization voltage Vint) is applied to the gate electrode G1 during the initialization period. As a result, the data voltage Dm inputted into the first electrode S1 of the driving transistor T1 is outputted from the second electrode D1 through the channel of the driving transistor T1, and then is stored in the second storage electrode E2 of the storage capacitor Cst through the third transistor T3.

In this case, the voltage applied to the second storage electrode E2 may be varied depending on the threshold voltage Vth of the driving transistor T1. When the data voltage Dm is applied to the first electrode S1 of the driving transistor T1 and the initialization voltage Vint is applied to the gate electrode G1 of the driving transistor T1, the voltage outputted into the second electrode D1 may have a value of Vgs+Vth. Vgs indicates a difference between voltages applied to the gate electrode G1 and the first electrode S1 of the driving transistor T1, and may have a value of Dm−Vint. Therefore, the voltage that is outputted from the second electrode D1 and is stored in the second storage electrode E2 may have a value of Dm−Vint+Vth.

Thereafter, during an emission period, the light emission control signal EM supplied from the light emission control line 153 has a value of a low level to turn on the fifth transistor T5 and the sixth transistor T6. As a result, the driving voltage ELVDD is applied to the first electrode S1 of the driving transistor T1, and the second electrode D1 of the driving transistor T1 is connected to the organic light emitting diode OLED. The driving transistor T1 generates the driving current Id according to the voltage difference Vgs between the voltage of the gate electrode G1 and the voltage of the first electrode S1 (i.e., the driving voltage ELVDD). The driving current Id of the driving transistor T1 may have a value proportional to a square of Vgs−Vth. Herein, the value of Vgs is equal to a difference of the voltages applied to opposite ends of the storage capacitor Cst, and Vgs has a value of Vg−Vs, and thus it has a value of Dm−Vint+Vth−ELVDD. Herein, the value of Vgs−Vth is obtained by subtracting the value of Vth, and it has a value of Dm−Vint−ELVDD. That is, the driving current Id of the driving transistor T1 has a current irrespective of the threshold voltage Vth of the driving transistor T1 as an output.

Accordingly, even when the driving transistor T1 disposed in each pixel PX has a different threshold voltage Vth due to process dispersion, an output current of the driving transistor T1 may be made constant, thereby ameliorating non-uniformity of the characteristic.

In the above equation, the value of Vth may be slightly larger than 0 or a negative value in the case of a P-type transistor using a polycrystalline semiconductor. Further, the expression of "+" and "−" may be changed depending on a direction in which the voltage is calculated. However, there is no difference in that the driving current Id, which is the output current of the driving transistor T1, may have a value independent from the value of the threshold voltage Vth.

When the above-mentioned emitting period ends, the initialization period starts again, and the same operation is repeated from the beginning.

Each of the first electrode and the second electrode of each of the transistors T1, T2, T3, T4, T5, T6, and T7 may be a source electrode or a drain electrode depending on the direction in which a voltage or a current is applied.

Hereinafter, a pixel of an organic light emitting diode display according to an exemplary embodiment in which a cross-talk phenomenon is reduced by including a gate connector 156 and a bridge electrode 31 disposed separately from the data line 171 to replace the driving connector will be described with reference to FIG. 2 to FIG. 4.

Figure 2:
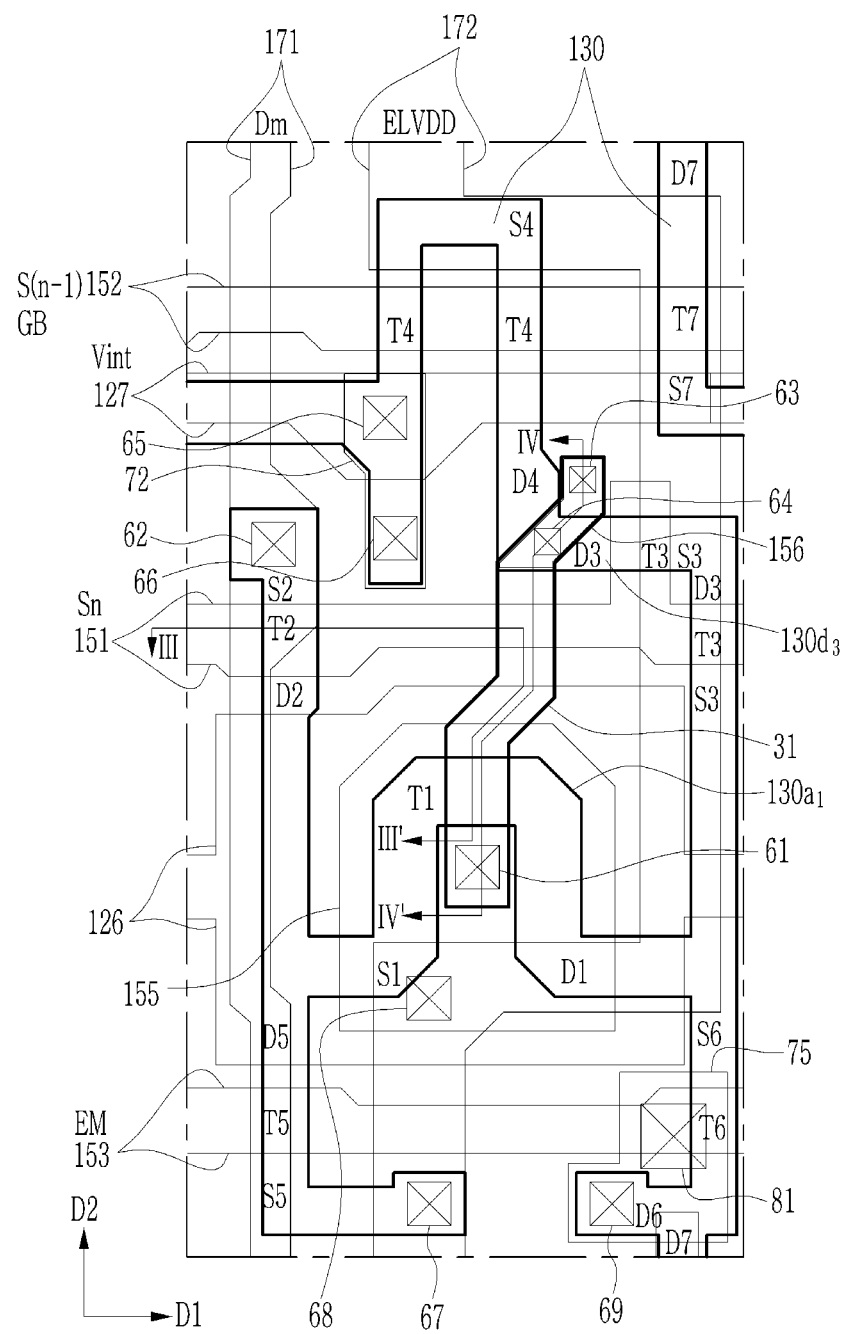
FIG. 2 illustrates a top plan view of an exemplary embodiment of a pixel area of an organic light emitting diode display according to the invention.
Figure 3:
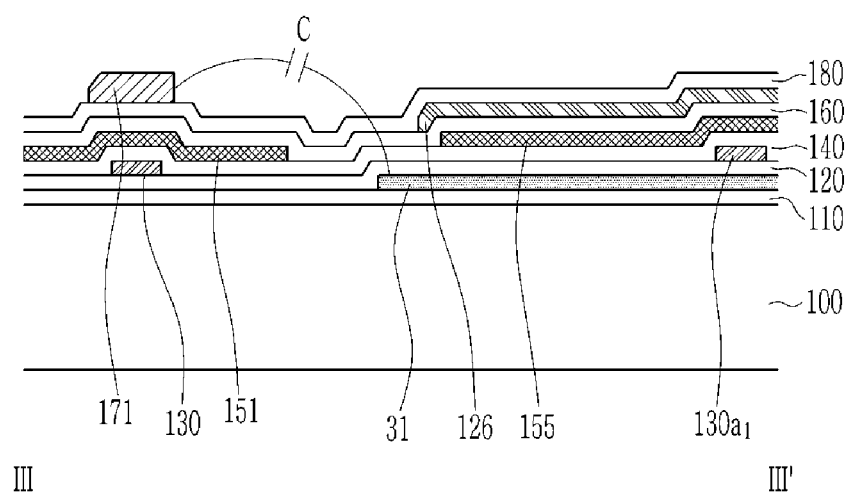
FIG. 3 illustrates a cross-sectional view taken along line of FIG. 2.
Figure 4:
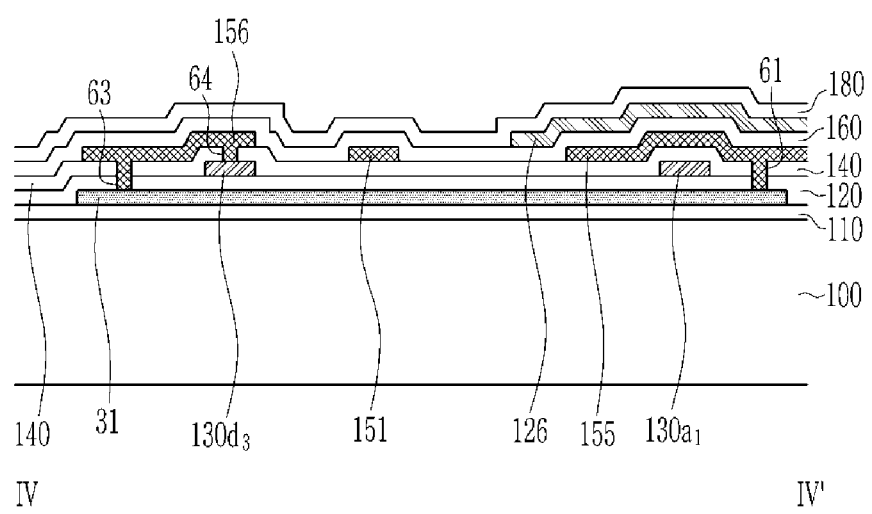
FIG. 4 illustrates a cross-sectional view taken along line IV-IV' of FIG. 2.

FIG. 2 illustrates a top plan view of an exemplary embodiment of a pixel of an organic light emitting diode display according to the invention, FIG. 3 illustrates a cross-sectional view taken along line of FIG. 2, and FIG. 4 illustrates a cross-sectional view taken along line IV-IV' of FIG. 2.

Referring to FIG. 2, according to the exemplary embodiment, the organic light emitting diode display includes a scan line 151, a previous-stage scan line 152, a light emission control line 153, and an initialization voltage line 127 which extend mainly along a first direction D1, which respectively transfer a scan signal Sn, a previous-stage scan signal S(n−1), a light emission control signal EM, and an initialization voltage Vint. A bypass signal GB is transferred through the previous-stage scan line 152. However, according to another exemplary embodiment, the bypass signal GB may be the same as a signal of the present scan line 151 or a signal of another scan line.

The organic light emitting diode display includes a data line 171 and a driving voltage line 172 extending along a second direction D2 that intersects the first direction D1, which transfer a data voltage Dm and a driving voltage ELVDD, respectively.

The light emitting diode display includes a driving transistor T1, a second transistor T2, a third transistor T3, a fourth transistor T4, a fifth transistor T5, a sixth transistor T6, a seventh transistor T7, a storage capacitor Cst, and an organic light-emitting diode OLED.

Each channel of the driving transistor T1, the second transistor T2, the third transistor T3, the fourth transistor T4, the fifth transistor T5, the sixth transistor T6, and the seventh transistor T7 is disposed in a semiconductor layer 130 which extends long. In addition, at least portions of the first and second electrodes of the transistors T1, T2, T3, T4, T5, T6, and T7 are disposed in the semiconductor layer 130. The semiconductor layer 130 may be bent in various shapes. In an exemplary embodiment, the semiconductor layer 130 may include an oxide semiconductor or a polycrystalline semiconductor made of polysilicon.

The semiconductor layer 130 includes a channel doped with an N-type impurity or a P-type impurity and a first doped region and a second doped region disposed at opposite sides of the channel and having a higher doping concentration than an impurity doped in the channel. The first doped region and the second doped region correspond to the first electrode and the second electrode of each of the transistors T1, T2, T3, T4, T5, T6, and T7. If one of the first doped region and the second doped region is a source region, the other doped region is a drain region. In addition, regions between the first electrodes and the second electrodes of different transistors may be doped in the semiconductor layer such that the transistors may be electrically connected to each other.

Each channel of the transistors T1, T2, T3, T4, T5, T6, and T7 overlaps the gate electrode of the corresponding transistor in the plan view, and is disposed between the first electrode and the second electrode of the corresponding transistor. The transistors T1, T2, T3, T4, T5, T6, and T7 may have the substantially same stacked structure. Hereinafter, the driving transistor T1 will be described in detail, and the remaining transistors T2, T3, T4, T5, T6, and T7 will be briefly described.

The driving transistor T1 includes a channel, a first gate electrode 155, a first electrode S1, and a second electrode D1. The channel of the driving transistor T1 is disposed between the first electrode S1 and the second electrode D1 to overlap the first gate electrode 155 in the top plan view. The channel is curved in order to form a longer channel length within a limited region compared with the case that channel is straight. As the length of the channel becomes longer, a driving range of the gate voltage Vg applied to the first gate electrode 155 of the driving transistor T1 is widened and a driving current Id is constantly increased depending on the gate voltage Vg. As a result, it is possible to control a gray scale of light emitted from the organic light-emitting diode OLED more minutely and to improve display quality of the light emitting diode display by adjusting a magnitude of the gate voltage Vg. In addition, since the channel extends in various directions rather than extending in one direction, there is an advantage that the effect of the orientation in the manufacturing process is offset, thereby reducing a process scattering influence. Accordingly, it is possible to prevent image quality deterioration such as a stain defect that may occur by a characteristic variation of the driving transistor T1 depending on regions of the display device due to process scattering (e.g., a luminance difference occurred depending on the pixel even when the same data voltage Dm is applied). A shape of such channels according to the invention is not limited to the illustrated Q-type, but may be various such as a U-shape, an S-shape, and the like.

Referring to FIG. 3, the first gate electrode 155 overlaps the channel of the driving transistor T1 in the top plan view. The first electrode S1 and the second electrode D1 are disposed at opposite sides of the channel, respectively. An insulated extension of a storage electrode 126 is disposed on the first gate electrode 155. The extension of the storage electrode 126 overlaps the first gate electrode 155, with a second gate insulating layer 160 interposed therebetween in the top plan view to constitute a storage capacitor Cst. The extension of the storage electrode 126 serves as a first storage electrode E1 of the storage capacitor Cst (see FIG. 1), and the first gate electrode 155 serves as a second storage electrode E2 (see FIG. 1).

Referring back to FIG. 2, a gate electrode of the second transistor T2 may be a portion of the scan line 151. The data line 171 is connected to a first electrode S2 of the second transistor T2 through a contact hole 62. The first electrode S2 and the second electrode D2 of the second transistor T2 may be disposed on the semiconductor layer 130.

The third transistor T3 may be disposed to include two transistors adjacent to each other, as illustrated at a left side and a lower side with reference to a portion where the semiconductor layer 130 is folded in FIG. 2. Each of these two parts serves as the third transistor T3. A first electrode S3 of a first third transistor T3 in the left side is connected to a second electrode D3 of a second third transistor T3 in the lower side. A gate electrode of the two third transistors T3 may be a portion of the scan line 151 or a portion that protrudes upward or downward from the scan line 151. Such a structure may be referred to as a dual-gate structure, and may prevent a leakage current from flowing. The first electrode S3 of the third transistor T3 (i.e., second third transistor in the lower side) is connected to a first electrode S6 of the sixth transistor T6 and the second electrode D1 of the driving transistor T1.

The fourth transistor T4 is disposed at the portion where the previous-stage scan line 152 and the semiconductor layer 130 meet. A gate electrode of the second transistor T2 may be a portion of the previous-stage scan line 152. A first electrode S4 of a first fourth transistor T4 is connected to a second electrode D4 of a second fourth transistor T4. Such a structure may be referred to as a dual-gate structure, and may prevent a leakage current from flowing. The second electrode D4 of the fourth transistor T4 in a right side is connected to the second electrode D3 of the third transistor T3 through the semiconductor layer 130.

A gate electrode of the fifth transistor T5 may be a portion of the light emission control line 153. The driving voltage line 172 is connected to a first electrode S5 of the fifth transistor T5 through a contact hole 67, and a second electrode D5 is connected to the first electrode S1 of the driving transistor T1 through the semiconductor layer 130.

A gate electrode of the sixth transistor T6 may be a portion of the light emission control line 153. A first connector 75 is connected to a second electrode D6 of the sixth transistor T6 through a contact hole 69, and a first electrode S6 is connected to the second electrode D1 of the driving transistor T1 through the semiconductor layer 130.

A gate electrode of the seventh transistor T7 may be a portion of the previous-stage scan line 152. A first electrode S7 of the fifth transistor T7 is connected to the first electrode S4 of the fourth transistor T4. The initialization voltage line 127 is connected to a second connector 72 through a contact hole 65. The second connector 72 may be connected to the semiconductor layer 130 through the contact hole 66, and the second electrode D7 may be connected to the second electrode D6 of the sixth transistor T6. The first electrode S7 the seventh transistor T7 and the second electrode D7 the seventh transistor T7 may be disposed on the semiconductor layer 130. The seventh transistor T7 illustrated in FIG. 2 operates a pixel disposed at an upper side of the illustrated pixel area. FIG. 2 schematically illustrates one pixel area, and the seventh transistor T7 which is operated in a pixel area according to the exemplary embodiment is disposed in the semiconductor layer 130 extending from the second electrode D6 of the sixth transistor T6. In a pixel area according to the exemplary embodiment, the second electrode D7 of the seventh transistor T7 is disposed at a lower side of the sixth transistor T6 to be connected to the second electrode D6 of the sixth transistor T6. In addition, in another pixel area of another exemplary embodiment, the first electrode S7 of the seventh transistor T7 may be disposed in the semiconductor layer 130 extending from the first electrode S4 of the fourth transistor T4.

The storage capacitor Cst includes a first storage electrode E1 and a second storage electrode E2 which overlap each other, with the second gate insulating layer 160 interposed therebetween. The second storage electrode E2 may correspond to the first gate electrode 155 of the driving transistor T1, and the first storage electrode E1 may correspond to the extension of the storage electrode 126. Herein, the second gate insulating layer 160 serves as a dielectric material, and a capacitance of the storage capacitor Cst is determined by the electric charges cumulated in the storage capacitor Cst and a voltage between the first and second storage electrodes E1 and E2. It is possible to secure a space in which the storage capacitor Cst can be disposed in the space narrowed by the channel of the driving transistor T1 occupying a large area within the pixel by using the first gate electrode 155 as the second storage electrode E2.

The driving voltage line 172 is connected to the first storage electrode E1 through a contact hole 68. Accordingly, the storage capacitor Cst stores a charge corresponding to a difference between the driving voltage ELVDD transferred to the first storage electrode E1 through the driving voltage line 172 and the gate voltage Vg of the first gate electrode 155.

A pixel electrode (not illustrated), which is referred to as an anode electrode, is connected to the first connector 75 through a contact hole 81.

The bridge electrode 31 overlaps the semiconductor layer 130 of the driving transistor T1, the first gate electrode 155, the storage electrode 126, the scan line 151, and the second electrode D3 of the third transistor T3, and the gate connector 156 in the plan view. The bridge electrode 31 may be disposed to cross the scan line 151, and may be disposed in parallel with the data line 171 and a portion of the driving voltage line 172.

Specifically, the bridge electrode 31 is disposed so as to extend from a central portion of the Q-type semiconductor layer 130 of the driving transistor T1 and through the second electrode D3 of the third transistor T3 in the second direction D2. A first end of the bridge electrode 31 extending through the second electrode D3 of the third transistor T3 may be disposed to be bent so as to not overlap the semiconductor layer 130.

A second end of the bridge electrode 31 is connected to the first gate electrode 155 through the contact hole 61.

The gate connector 156 is disposed to overlap one region of the bridge electrode 31 in the plan view. The gate connector 156 may extend from the second electrode D3 of the third transistor T3 in the second direction D2. The gate connector 156 may have an obliquely curved shape at one end so as to overlap an obliquely curved shape of the bridge electrode 31.

The bridge electrode 31 and the gate connector 156 are connected through the contact hole 63. The second electrode D3 of the third transistor T3 (i.e., the first third transistor T3 in the left side) and the gate connector 156 are connected through a contact hole 64.

As such, the bridge electrode 31 connects the first gate electrode 155 of the driving transistor T1 and the second electrode D3 of the third transistor T3 through the gate connector 156.

Referring to FIG. 1 again, it may be seen that the gate electrode G1 of the driving transistor T1 and the second electrode D3 of the third transistor T3 are electrically connected to each other through the driving gate node Q.

In general, the driving transistor T1 controls the driving current Id flowing to the organic light emitting diode OLED, and stores a data voltage in the storage capacitor Cst connected to the driving gate node Q of the driving transistor T1 to maintain it for one frame. Accordingly, a certain amount of driving current Id is supplied from the driving transistor T1 to the organic light emitting diode OLED during one frame to emit light.

A voltage variation of the data line 171 affects the voltage of the driving gate node Q of the driving transistor T1 since parasitic capacitance exists between the data line 171 and the driving connector connecting the first gate electrode G1 of the driving transistor T1 to the second electrode D3 of the third transistor T3. The voltage variation of the driving gate node Q induces a change of the driving current Id flowing through the organic light emitting diode OLED, causing a crosstalk phenomenon in which luminance of the display device changes.

Hereinafter, a pixel of an organic light emitting diode display according to an exemplary embodiment in which a cross-talk phenomenon is reduced by including the gate connector 156 and the bridge electrode 31 disposed separated from the data line 171 to replace the driving connector will be described following on a stacking order with reference to FIG. 3 and FIG. 4.

FIG. 3 illustrates a cross-sectional view taken along line of FIG. 2, and FIG. 4 illustrates a cross-sectional view taken along line IV-IV' of FIG. 2.

Referring to FIG. 3, the organic light emitting diode display according to the exemplary embodiment uses a substrate 100 made of a flexible material such as plastic or polyimide (PI), or glass, for example. A barrier layer 110 is disposed on the substrate 100, and a bridge electrode 31 made of a metal having conductivity or a semiconductor material having a similar conductive characteristic is disposed on the barrier layer 110. A buffer layer 120 is disposed on the bridge electrode 31 so as to cover the bridge electrode 31. In an exemplary embodiment, the layers 110 and 120 may be made of an inorganic insulating material such as a silicon oxide, a silicon nitride, and an aluminum oxide, and may also include an organic insulating material such as polyimide or polyacryl (epoxy).

A semiconductor layer 130 including a channel 130a1 of the driving transistor T1 and a drain region of the second transistor T2 is disposed on the buffer layer 120.

A first gate insulating layer 140 covering the semiconductor layer 130 is disposed on the semiconductor layer 130. The scan line 151 and the first gate electrode 155 of the driving transistor T1 are disposed on the first gate insulating layer 140. The scan line 151, the first gate electrode 155, the gate electrodes of the transistors, and the gate connector 156 disposed on the first gate insulating layer 140 may be referred to as a first gate conductor.

A second gate insulating layer 160 covering the first gate conductor is disposed on the first gate conductor. In an exemplary embodiment, the first gate insulating layer 140 and the second gate insulating layer 160 may include a material such as a silicon nitride, a silicon oxide, and an aluminum oxide. The storage electrode 126 may be disposed on the second gate insulating layer 160, and the storage electrode 126, the initialization voltage line 127, etc. disposed on the second gate insulating layer 160 may be referred to as a second gate conductor.

An interlayer-insulating layer 180 covering the second gate conductor is disposed on the second gate conductor. In an exemplary embodiment, the interlayer-insulating layer 180 may be made of a material such as a silicon nitride, a silicon oxide, and an aluminum oxide, and may be made of an organic insulating material. The data line 171 may be disposed on the interlayer-insulating layer 180, and the data line 171, the driving voltage line 172, the first connector 75, the second connector 72, and the driving connector (not illustrated, see reference number 71 of FIG. 5) disposed on the interlayer-insulating layer 180 may be referred to as a data conductor.

The data line 171 is disposed far away from the bridge electrode 31 with the first gate insulating layer 140, the second gate insulating layer 160, the first gate conductor and the second gate conductor therebetween. Accordingly, a value of parasitic capacitance C existing between the data line 171 and the bridge electrode 31 is reduced, and the voltage of the driving gate node Q of the driving transistor T1 is less affected by the voltage variation of the data line 171. Accordingly, the driving current Id flowing through the organic light emitting diode OLED is constantly maintained, so that the luminance of the organic light emitting diode is hardly changed.

Hereinafter, a structure in which the gate electrode G1 of the driving transistor T1 and the second electrode D3 of the third transistor T3 are connected by the bridge electrode 31 will be described in detail with reference to FIG. 4.

An organic light emitting diode display according to an exemplary embodiment may use a substrate 100 made of a flexible material. A barrier layer 110 is disposed on the substrate 100, and a bridge electrode 31 made of a metal having conductivity or a semiconductor material having a similar conductive characteristic is disposed on the barrier layer 110. A buffer layer 120 is disposed on the bridge electrode 31.

A semiconductor layer 130 including a drain region 130d3 indicating the second electrode D3 of the third transistor T3 and a channel 130a1 of the driving transistor T1 is disposed on the buffer layer 120.

A first gate insulating layer 140 covering the semiconductor layer 130 is disposed on the semiconductor layer 130. The first gate electrode 155 of the driving transistor T1, the scan line 151, and the gate connector 156 are disposed on the first gate insulating layer 140. The first gate electrode 155 of the driving transistor T1 may be disposed to overlap the channel 130a1 of the driving transistor T1 and the bridge electrode 31.

The gate connector 156 is disposed to overlap the drain region 130d3 of the third transistor T3 and a partial region of the bridge electrode 31. A first end of the gate connector 156 may be disposed within the bridge electrode 31.

The first gate electrode 155 is connected to the bridge electrode 31 through a contact hole 61, and the gate connector 156 is connected to the bridge electrode 31 through a contact hole 63. In addition, the gate connector 156 is connected to the drain region 130d3 of the third transistor T3 through the contact hole 64.

In other words, the third transistor T3 may transfer a compensated voltage Dm+Vth from the drain region 130d3 to the gate electrode G1 of the driving transistor T1 through the gate connector 156 and the bridge electrode 31.

A second gate insulating layer 160 is disposed on the first gate electrode 155, the scan line 151, and the gate connector 156 to cover them. The storage electrode 126 is disposed on the second gate insulating layer 160, and an interlayer-insulating layer 180 is disposed on the storage electrode 126. Herein, the storage electrode 126 may be disposed to partially overlap the first gate electrode 155.

Although not shown in FIG. 4, a data conductor is disposed on the interlayer-insulating layer 180, and a passivation layer (not illustrated) covering the data conductor may be disposed on the data conductor. The passivation layer may be made of an organic insulating material, for example. A pixel electrode (not illustrated) may be disposed on the passivation layer, and the pixel electrode may be connected to the data conductor through a contact hole disposed in the passivation layer. A barrier rib (not illustrated) may be disposed on the passivation layer and the pixel electrode. The barrier rib may define an open portion that overlaps the pixel electrode, and an organic light emitting layer may be disposed in the open portion. A common electrode (not illustrated) may be disposed on the organic emission layer and the barrier rib. The pixel electrode, the organic emission layer, and the common electrode may constitute an organic light emitting diode OLED. When holes and electrons are injected from the pixel electrode and the common electrode into the organic emission layer in the organic light emitting diode OLED, excitons formed by combining the injected holes and electrons are emitted when they fall from an excited state to a ground state.

Hereinafter, a plan view and a cross-sectional view of an organic light emitting diode display according to an exemplary embodiment in which a cross-talk phenomenon is reduced by including the gate connector 156, the short driving connector 71, and the bridge electrode 31 disposed separately from the data line 171 to replace the driving connector will be described following a stacking order with reference to FIG. 5 and FIG. 6. A description of the same constituent elements as the constituent elements described above will be omitted.

Figure 5:
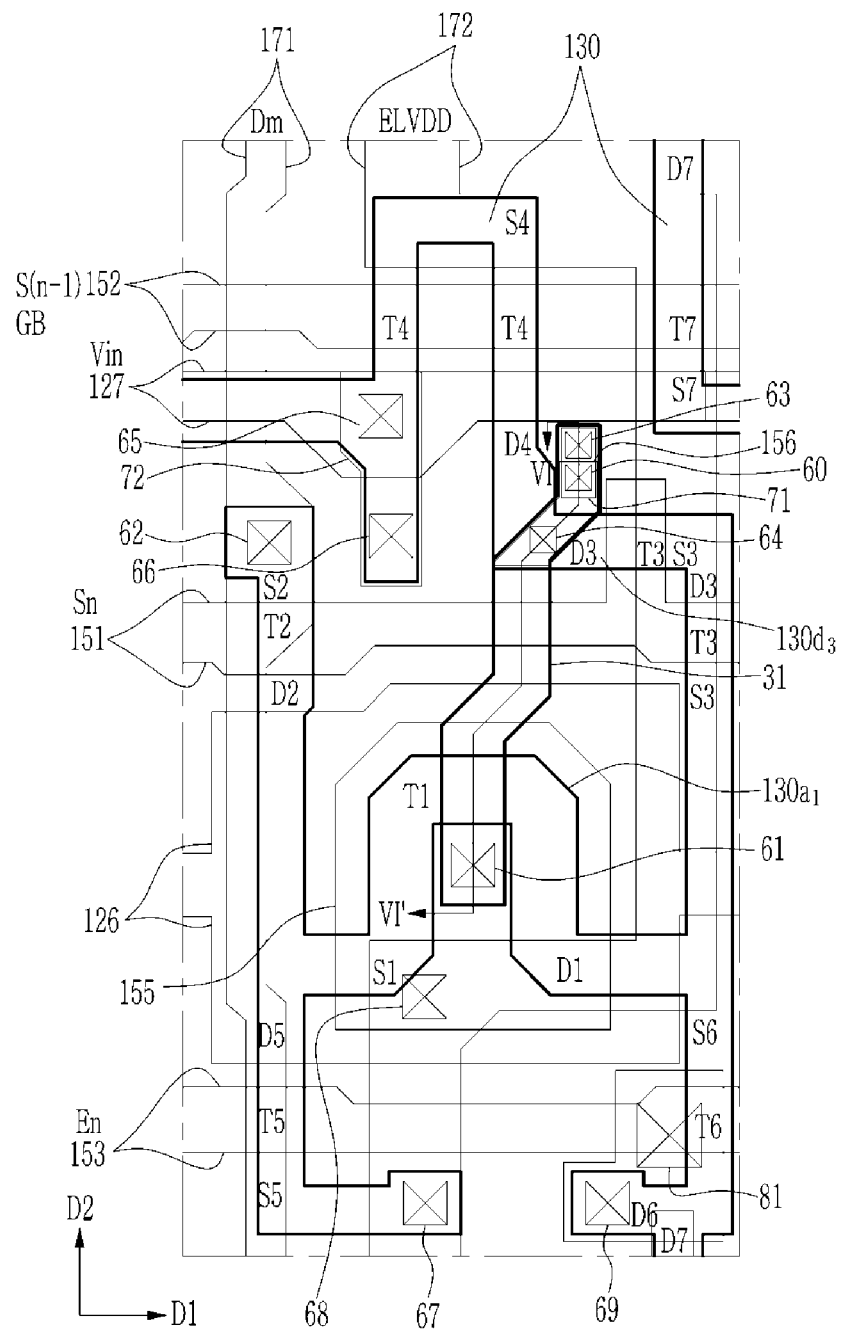
FIG. 5 illustrates a top plan view of another exemplary embodiment of a pixel area of an organic light emitting diode display according to the invention.
Figure 6:
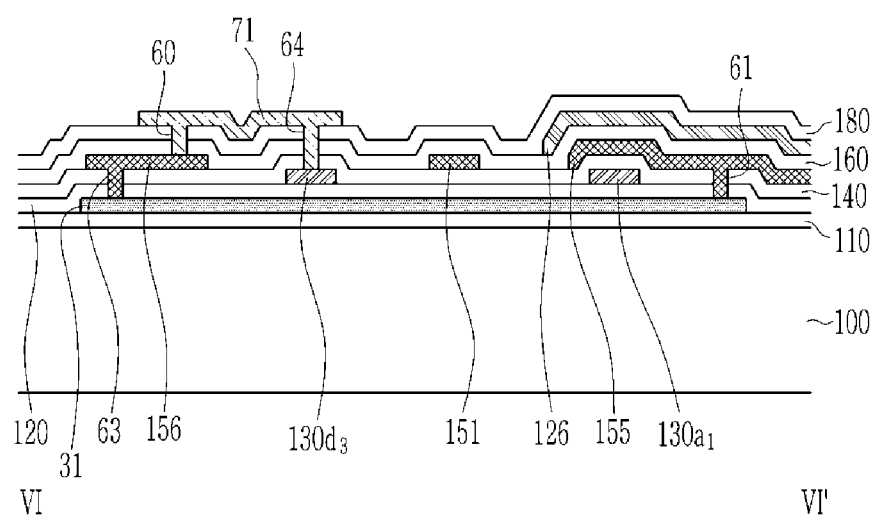
FIG. 6 illustrates a cross-sectional view taken along line VI-VI' of FIG. 5.

FIG. 5 illustrates a top plan view of another exemplary embodiment of a pixel area of an organic light emitting diode display according to the invention, and FIG. 6 illustrates a cross-sectional view taken along line V-V' of FIG. 5.

Referring to FIG. 5, the bridge electrode 31 is disposed to cross the scan line 151, and is disposed in parallel with the data line 171 and a portion of the driving voltage line 172.

The bridge electrode 31 is disposed so as to extend from a central portion of the Ω-type semiconductor layer 130 of the driving transistor T1 and through the second electrode D3 of the third transistor T3 in the second direction D2. The bridge electrode 31 overlaps the first gate electrode 155, the storage electrode 126, and a portion of the scan line 151 in the plan view, and a first end of the extended bridge electrode 31 may be disposed to be bent so as to not overlap the semiconductor layer 130. According to another exemplary embodiment, when the semiconductor layer 130 is U-shaped, the bridge electrode 31 may be disposed to have a short length.

The bridge electrode 31 is connected to the first gate electrode 155 through the contact hole 61.

The gate connector 156 and the driving connector 71 are disposed to overlap the bridge electrode 31, but do not overlap the scan line 151. The driving connector 71 is disposed to partially overlap the gate connector 156 and the bridge electrode 31, and to overlap the second electrode D3 of the third transistor T3. Herein, the driving connector 71 may be disposed obliquely to overlap the bridge electrode 31 and the second electrode D3 of the third transistor T3.

The driving connector 71 may be disposed in various shapes to overlap the gate electrode 155, the bridge electrode 31, and the second electrode D3 of the third transistor T3. Specifically, in an exemplary embodiment, it may be disposed in various shapes such as an oblique polygon, a long extended polygon, and a polygon including a chamfer. The gate connector 156 may be disposed in a polygonal shape including a rectangle and a polygon including a chamfer so as to overlap one region of the bridge electrode 31 and one region of the driving connector 71.

The bridge electrode 31 and the gate connector 156 are connected through the contact hole 63, and the gate connector 156 and the driving connector 71 are connected through the contact hole 60. In addition, the driving connector 71 is connected to the second electrode D3 (i.e., the drain region 130d3 in FIG. 6) of the third transistor T3 through the contact hole 64.

As such, the bridge electrode 31 connects the first gate electrode 155 of the driving transistor T1 and the second electrode D3 of the third transistor T3 through the gate connector 156 and the driving connector 71.

Hereinafter, a structure in which the bridge electrode 31 is connected to the first gate electrode 155 of the driving transistor T1 and the drain region 130d3 of the third transistor T3 will be described in detail with reference to a cross-sectional view of FIG. 6.

Referring to FIG. 6, the organic light emitting diode display according to an exemplary embodiment includes the bridge electrode 31 on the barrier layer 110. A buffer layer 120 is disposed on the bridge electrode 31 so as to cover the bridge electrode 31.

A semiconductor layer 130 including a drain region 130d3 indicating the second electrode D3 of the third transistor T3 and a channel 130a1 of the driving transistor T1 is disposed on the buffer layer 120.

A first gate insulating layer 140 covering the semiconductor layer 130 is disposed on the semiconductor layer 130. The first gate electrode 155 of the driving transistor T1, the scan line 151, and the gate connector 156 are disposed on the first gate insulating layer 140. The first gate electrode 155 of the driving transistor T1 may be disposed to overlap a portion of the channel 130a1 of the driving transistor T1 and the bridge electrode 31.

The second gate insulating layer 160 is disposed on the first gate electrode 155 and the scan line 151 to cover them. The storage electrode 126 disposed on the second gate insulating layer 160 may overlap the gate electrode 155, the bridge electrode 31, and the channel 130a1 of the driving transistor T1.

The interlayer-insulating layer 180 is disposed on the storage electrode 126 so as to cover the storage electrode 126. A driving connector 71 is disposed on the interlayer-insulating layer 180. The driving connector 71 may be disposed to overlap the gate connector 156, the drain region 130d3, and the bridge electrode 31.

The driving connector 71 is connected to the drain region 130d3 through the contact hole 64, and connected to the gate connector 156 through a contact hole 60. The gate connector 156 is connected to the bridge electrode 31 through the contact hole 63. In addition, the first gate electrode 155 is connected to the bridge electrode 31 through the contact hole 61.

In other words, the third transistor T3 may transfer the compensated voltage Dm+Vth from the drain region 130d3 to the gate electrode G1 of the driving transistor T1 through the driving connector 71, the gate connector 156, and the bridge electrode 31.

The organic light emitting diode display according to the exemplary embodiment may connect the third transistor T3 and the driving transistor T1 even by using the driving connector 71 only at a short region, so as to reduce parasitic capacitance existing between the data line 171 and the driving connector 71.

In addition, after forming the bridge electrode 31 at an upper portion of the barrier layer 110, the gate connector 156 may be disposed when the first gate conductor is disposed, and the driving connector 71 when the data conductor is disposed, and thus it is possible to provide an organic light emitting diode display in which the cross-talk is reduced without using an additional mask process.

Hereinafter, a pixel of an organic light emitting diode display according to an exemplary embodiment in which a cross-talk phenomenon is reduced by including the bridge electrode 31 disposed separately from the data line 171 to replace the driving connector will be described with reference to FIG. 7 and FIG. 8.

Figure 7:
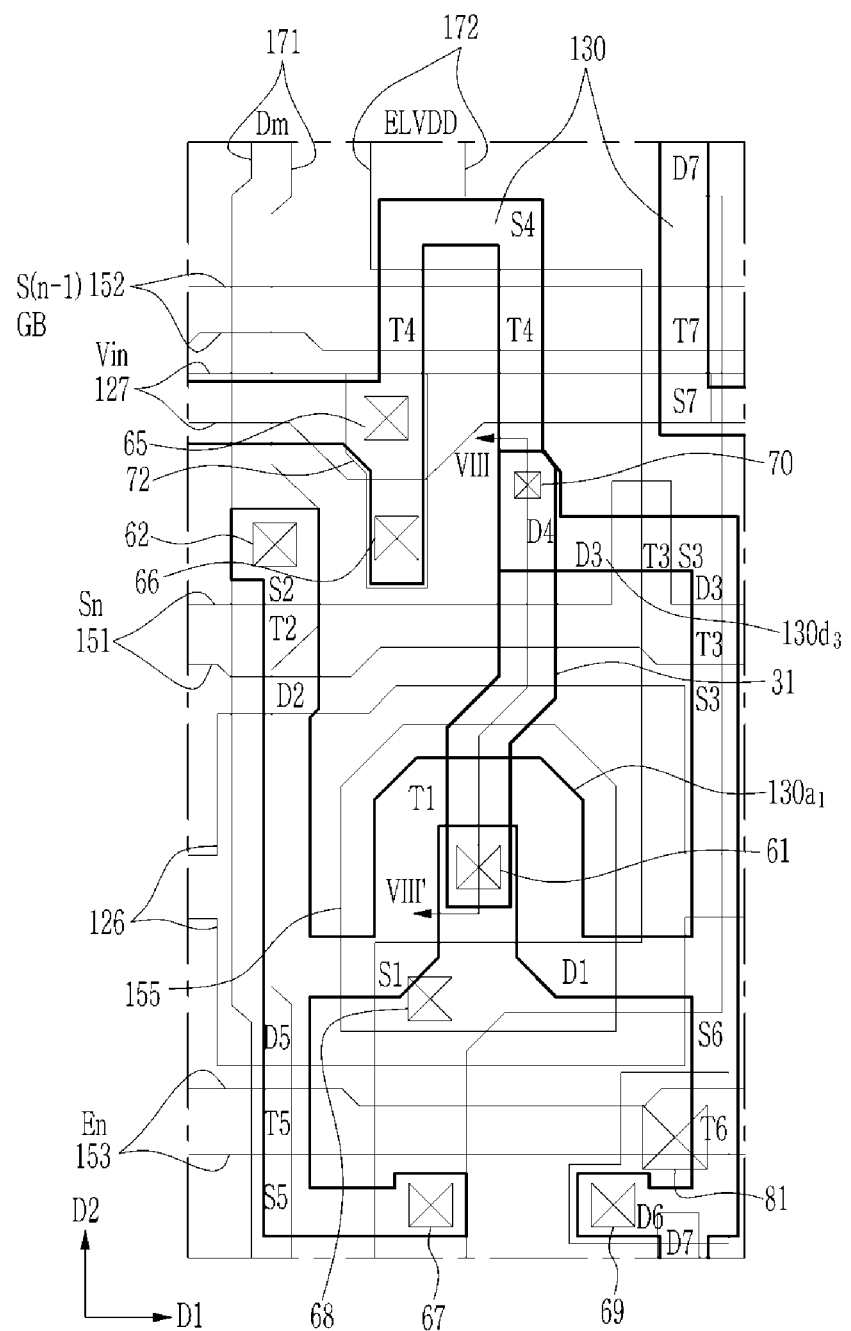
FIG. 7 illustrates a top plan view of still another exemplary embodiment of a pixel area of an organic light emitting diode display according to the invention.
Figure 8:
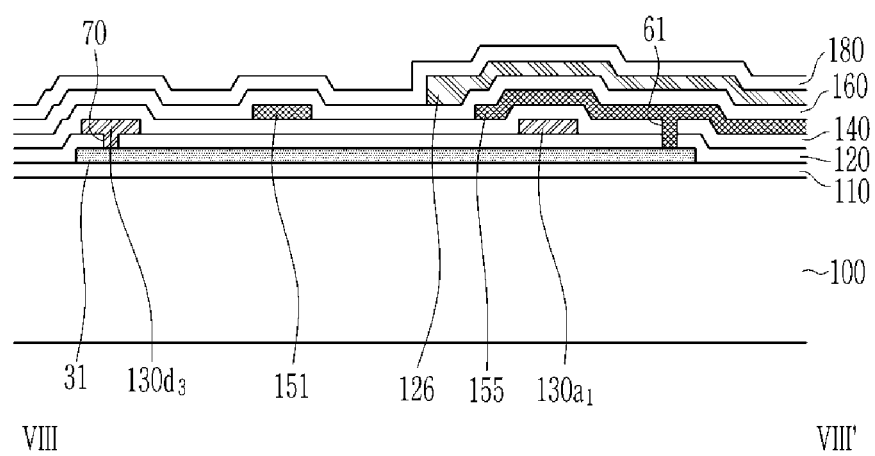
FIG. 8 illustrates a cross-sectional view taken along line VIII-VIII' of FIG. 7.

FIG. 7 illustrates a top plan view of still another exemplary embodiment of an organic light emitting diode display according to the invention, and FIG. 8 illustrates a cross-sectional view taken along line VIII-VIII' of FIG. 7.

Referring to FIG. 7, the bridge electrode 31 is disposed to cross the scan line 151, and is disposed in parallel with the data line 171 and a portion of the driving voltage line 172.

The bridge electrode 31 is disposed so as to extend from a central portion of the Ω-type semiconductor layer 130 of the driving transistor T1 and through the second electrode D3 of the third transistor T3 in the second direction D2. The bridge electrode 31 overlaps the first gate electrode 155, the storage electrode 126, and a portion of the scan line 151 and may be disposed even in the drain region 130d3 of the third transistor T3. The bridge electrode 31 may have a long rectangular shape, but may include a partially bent shape in order to avoid overlapping other wires in the plan view.

The bridge electrode 31 connects the drain region 130d3 of the third transistor T3 and the first gate electrode 155.

Hereinafter, a shape in which the bridge electrode 31 connects the first gate electrode 155 of the driving transistor T1 and the drain region 130d3 of the third transistor T3 will be described in detail with reference to a cross-sectional view of FIG. 8.

Referring to FIG. 8, the organic light emitting diode display according to an exemplary embodiment includes the bridge electrode 31 on the barrier layer 110. A buffer layer 120 is disposed on the bridge electrode 31 so as to cover the bridge electrode 31.

A semiconductor layer 130 including a drain region 130d3 indicating the second electrode D3 of the third transistor T3, and a channel 130a1 of the driving transistor T1 is disposed on the buffer layer 120.

A first gate insulating layer 140 covering the semiconductor layer 130 is disposed on the semiconductor layer 130. The scan line 151 and the first gate electrode 155 of the driving transistor T1 are disposed on the first gate insulating layer 140.

The drain region 130d3 is connected to the bridge electrode 31 through a contact hole 70, and the first gate electrode 155 of the driving transistor T1 is connected to the bridge electrode 31 by the contact hole 61.

In other words, the third transistor T3 may transfer the compensated voltage Dm+Vth from the drain region 130d3 to the gate electrode G1 of the driving transistor T1, by the bridge electrode 31.

Hereinafter, a pixel of an organic light emitting diode display according to an exemplary embodiment in which a cross-talk phenomenon is reduced by including the gate connector 156 and the bridge electrode 31 in a case that the semiconductor layer 130 of the driving transistor T1 has another shape will be described with reference to FIG. 9 and FIG. 10.

Figure 9:
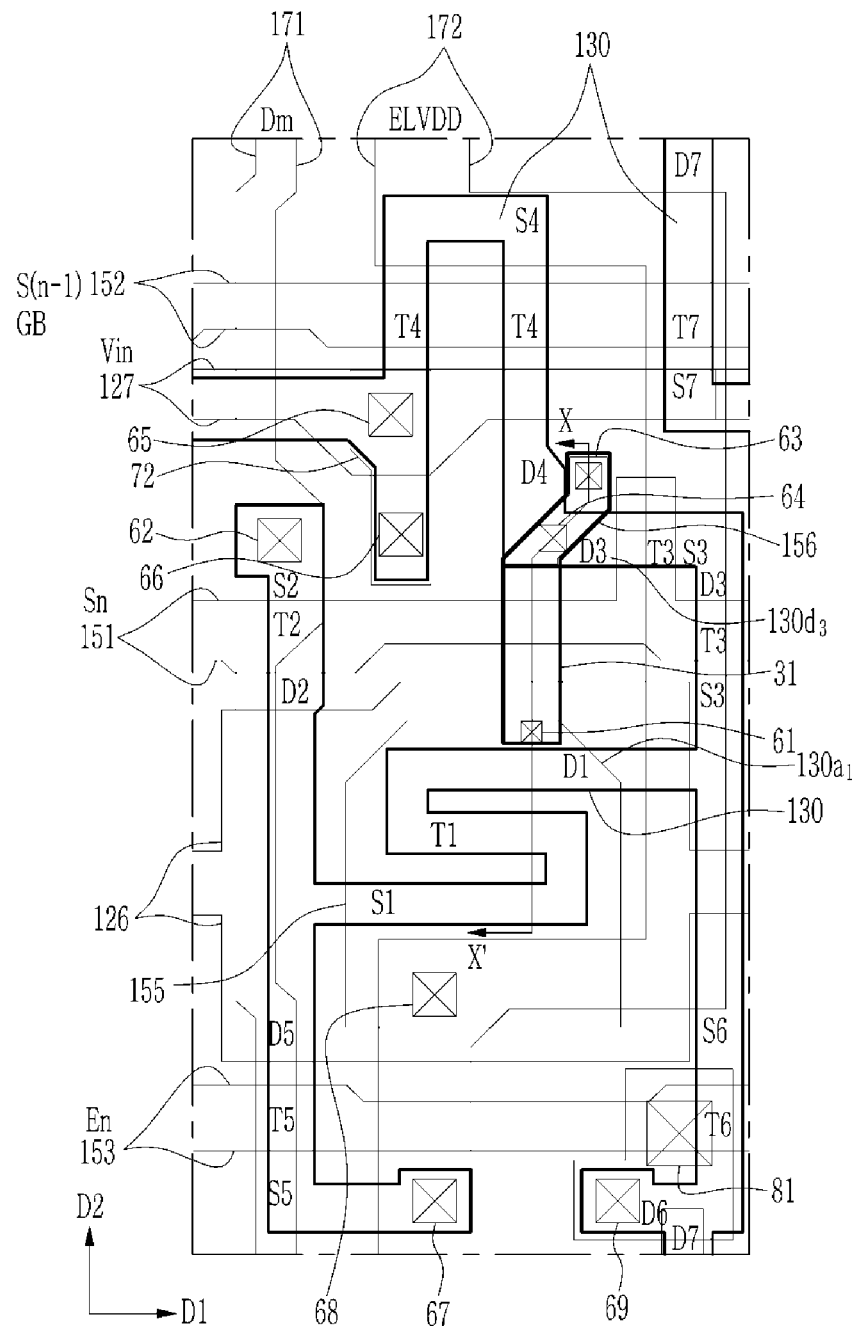
FIG. 9 illustrates a top plan view of still another exemplary embodiment of a pixel area of an organic light emitting diode display according to the invention.
Figure 10:
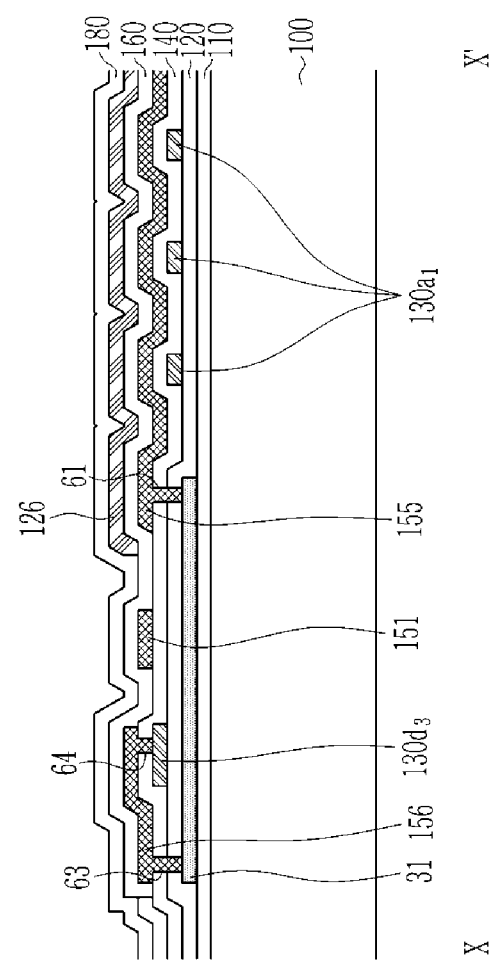
FIG. 10 illustrates a cross-sectional view taken along line X-X' of FIG. 9.

FIG. 9 illustrates a top plan view of still another exemplary embodiment of an organic light emitting diode display according to the invention, and FIG. 10 illustrates a cross-sectional view taken along line X-X' of FIG. 9.

Referring to FIG. 9, the semiconductor layer 130 of the driving transistor T1 has an 'S' shape.

The bridge electrode 31 overlaps the semiconductor layer 130 of the driving transistor T1, the first gate electrode 155, the storage electrode 126, the scan line 151, the second electrode D3 of the third transistor T3, and the gate connector 156 in the plan view. The bridge electrode 31 may be disposed to cross the scan line 151, and may be disposed in parallel with the data line 171 and a portion of the driving voltage line 172.

Specifically, the bridge electrode 31 is disposed so as to extend from an upper side of the S-type semiconductor layer 130 of the driving transistor T1 and through the second electrode D3 of the third transistor T3 in the second direction D2. A first end of the bridge electrode 31 extending through the second electrode D3 of the third transistor T3 may be disposed to be bent so as to not overlap the semiconductor layer 130 in the plan view.

The bridge electrode 31 is connected to the first gate electrode 155 through the contact hole 61.

The gate connector 156 is disposed to overlap one region of the bridge electrode 31. The gate connector 156 may extend from second electrode D3 of the third transistor T3 in the second direction D2. The gate connector 156 may have an obliquely curved shape so as to overlap an obliquely curved shape of the bridge electrode 31 in the plan view.

The bridge electrode 31 and the gate connector 156 are connected through the contact hole 63. The second electrode D3 (i.e., the drain region 130d3) of the third transistor T3 and the gate connector 156 are connected through the contact hole 64.

As such, the bridge electrode 31 connects the first gate electrode 155 of the driving transistor T1 and the second electrode D3 of the third transistor T3 through the gate connector 156.

Hereinafter, a structure in which the bridge electrode 31 is connected to the first gate electrode 155 of the driving transistor T1 and the drain region 130d3 of the third transistor T3 will be described with reference to a cross-sectional view of FIG. 10.

Referring to FIG. 10, the organic light emitting diode display according to an exemplary embodiment includes the bridge electrode 31 on the barrier layer 110. A buffer layer 120 is disposed on the bridge electrode 31 so as to cover the bridge electrode 31.

A semiconductor layer 130 is disposed on the buffer layer 120.

A semiconductor layer 130 includes a plurality of channels $130a_1$ and a drain region $130d3$. The plurality of channels $130a_1$ indicates channel regions of the driving transistor T1 and the drain region $130d_3$ indicates the second electrode D3 of the third transistor T3.

A first gate insulating layer 140 covering the semiconductor layer 130 is disposed on the semiconductor layer 130. The first gate electrode 155 of the driving transistor T1, the scan line 151, and the gate connector 156 are disposed on the first gate insulating layer 140.

The second gate insulating layer 160 is disposed on the first gate electrode 155 and the scan line 151 to cover them. The storage electrode 126 disposed on the second gate insulating layer 160 may overlap the gate electrode 155, the bridge electrode 31, and the channels 130a1 of the driving transistor T1 in the plan view.

The gate connector 156 is connected to the bridge electrode 31 through the contact hole 63, and is connected to the drain region 130d3 through the contact hole 64. In addition, the first gate electrode 155 is connected to the bridge electrode 31 through the contact hole 61.

In other words, the third transistor T3 may transfer a compensated voltage Dm+Vth from the drain region 130d3 to the gate electrode G1 of the driving transistor T1 through the gate connector 156 and the bridge electrode 31.

Therefore, since no gate driving connector in the data conductor layer is used, no parasitic capacitance between the data line 171 and the gate driving connector exists. Parasitic capacitance may exist between the data line 171 and the bridge electrode 31. However, since there are a plurality of layers between the data line 171 and the bridge electrode 31, the parasitic capacitance may be considerably reduced. As the parasitic capacitance decreases, the cross-talk phenomenon also decreases.

Hereinafter, a structure in which the cross-talk phenomenon is reduced through the bridge electrode 31 and the gate connector in an organic light emitting diode display according to another exemplary embodiment including the third gate conductor will be described with reference to FIG. 11 to FIG. 16.

Figure 11:
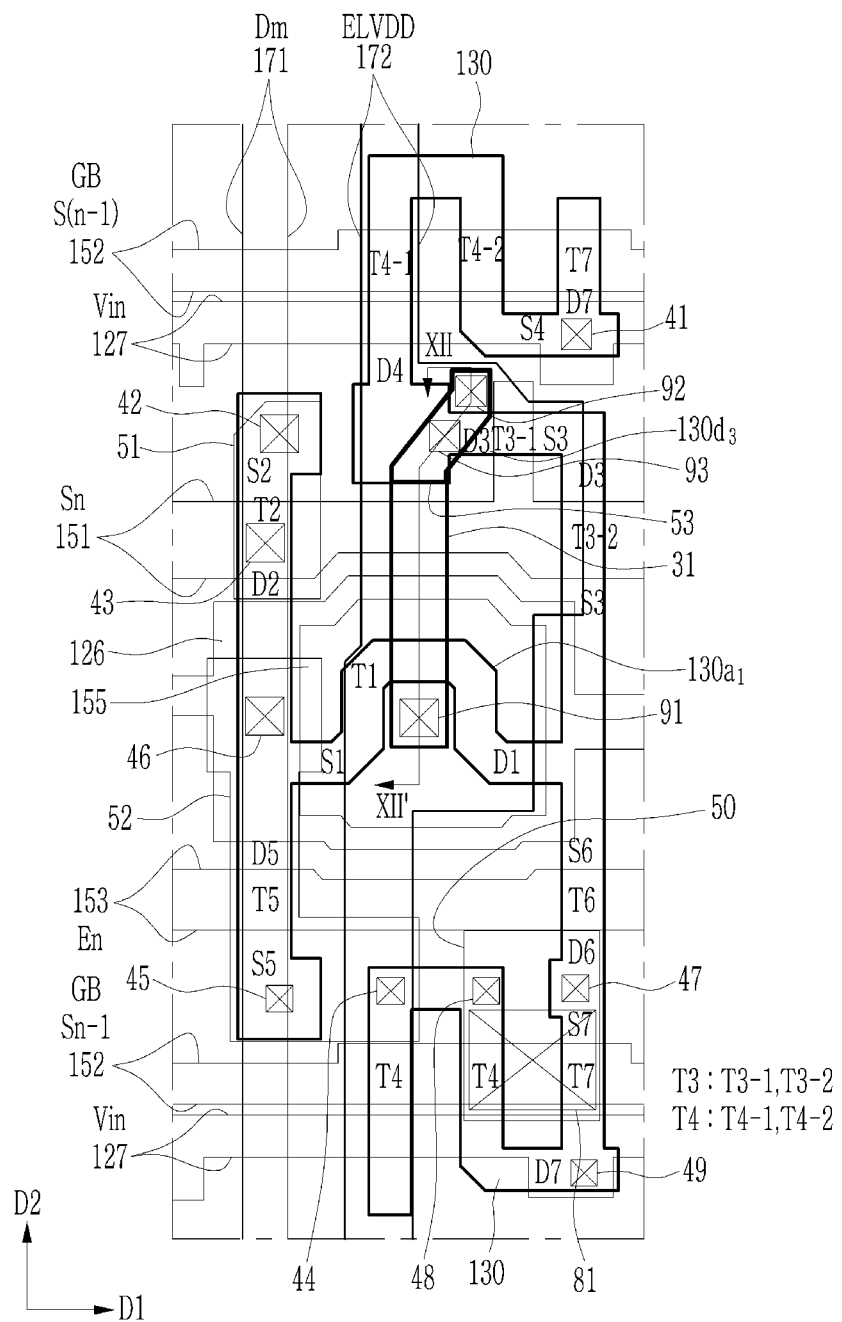
FIG. 11 illustrates a top plan view of an exemplary embodiment of a region including one pixel of an organic light emitting diode display according to the invention.
Figure 12:
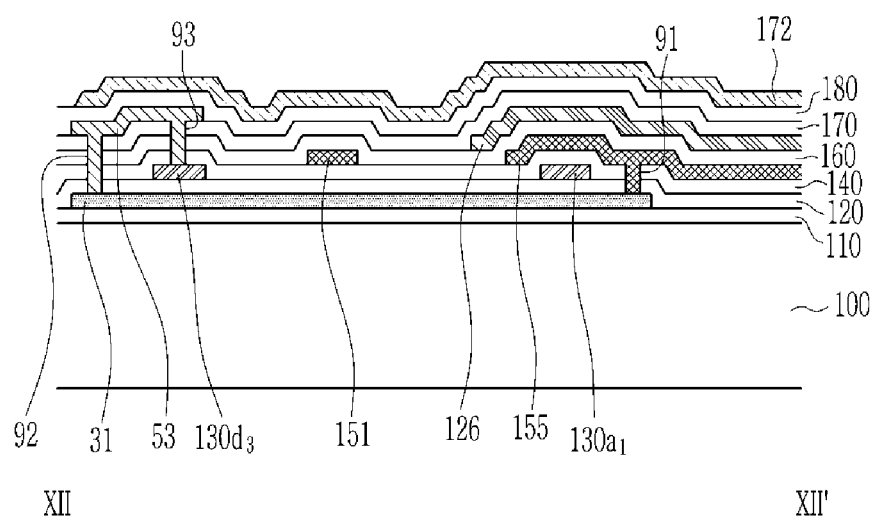
FIG. 12 illustrates a cross-sectional view taken along line XII-XII' of FIG. 11.

Referring to FIG. 11 and FIG. 12, the organic light emitting diode display according to the exemplary embodiment includes an upper gate connector 53 and the bridge electrode 31 disposed separately from the data line 171 to replace the driving connector.

FIG. 11 illustrates a top plan view of an exemplary embodiment of a region including one pixel of an organic light emitting diode display according to the invention, and FIG. 12 illustrates a cross-sectional view taken along line XII-XII' of FIG. 11.

Referring to FIG. 11, according to the exemplary embodiment, the organic light emitting diode display includes a scan line 151, a previous-stage scan line 152, a light emission control line 153, and an initialization voltage line 127 which extend mainly along a first direction D1 which transfer a scan signal Sn, a previous-stage scan signal S(n−1), a light emission control signal EM, and an initialization voltage Vint, respectively. Two previous-stage scan lines 152 and two initialization voltage lines 127 are illustrated in FIG. 11. A signal for driving an upper pixel area (not illustrated) may be applied to the previous-stage scan line 152 and the initialization voltage line 127 which are illustrated at an upper side of the scan line 151. In the exemplary embodiment, a scan signal Sn and an initialization voltage Vint may be applied from the previous-stage scan line 152 and the initialization voltage line 127 illustrated below the light emission control line 153, respectively.

The organic light emitting diode display includes a data line 171 and a driving voltage line 172 extending along a second direction D2 that intersects the first direction D1 which transfer a data voltage Dm and a driving voltage ELVDD, respectively. The driving voltage line 172 includes an extension having a slightly bent structure and an expanded width. The driving voltage line 172 extends to cover a portion of the driving transistor T1, portions of the third transistors T3-1 and T3-2, and portions of the fourth transistors T4-1 and T4-2.

One pixel PX of the light emitting diode display includes a driving transistor T1, a second transistor T2, a third transistor T3, a fourth transistor T4, a fifth transistor T5, a sixth transistor T6, a seventh transistor T7, a storage capacitor Cst, and an organic light-emitting diode OLED. The third transistor T3 has a structure in which two transistors T3-1 and T3-2 are connected with each other, and has a structure in which a signal inputted into a first-side transistor is outputted through a second-side transistor while being simultaneously turned on by the same gate signal.

In FIG. 11 and FIG. 12, even though an organic light emitting diode OLED is not illustrated, the organic light emitting diode OLED includes of a pixel electrode, an organic emission layer, and a common electrode. A structure of the organic light emitting diode OLED is disposed on the connection structure of the transistors T1 to T7 illustrated in FIG. 11.

Each channel of the driving transistor T1, the second transistor T2, the third transistor T3, the fourth transistor T4, the fifth transistor T5, the sixth transistor T6, and the seventh transistor T7 is disposed in the semiconductor layer 130 which extends long. In addition, at least portions of the first and second electrodes of the transistors T1, T2, T3, T4, T5, T6, and T7 are disposed in the semiconductor layer 130. The semiconductor layer 130 may be disposed to be bent in various shapes. The semiconductor layer 130 may include an oxide semiconductor or a polycrystalline semiconductor made of polysilicon, for example.

Each channel of the transistors T1, T2, T3, T4, T5, T6, and T7 overlaps a gate electrode of the corresponding transistor, and is disposed between the first electrode and the second electrode of the corresponding transistor. The transistors T1, T2, T3, T4, T5, T6, and T7 may have a substantially same stacked structure. Hereinafter, the driving transistor T1 will be described in detail, and the remaining transistors T2, T3, T4, T5, T6, and T7 will be briefly described.

The driving transistor T1 includes a channel, a first gate electrode 155, a first electrode S1, and a second electrode D1. The channel of the driving transistor T1 is disposed between the first electrode S1 and the second electrode D1 and overlaps the first gate electrode 155 in the top plan view. The channel is curved in order to form a longer channel length within a limited region compared with the case that channel is straight. A shape of such channels according to the invention is not limited to the illustrated Ω-type, but may be various such as a U-shape, an S-shape, and the like.

The first gate electrode 155 overlaps the channel in the top plan view. The first electrode S1 and the second electrode D1 are disposed at opposite sides of the channel, respectively. An insulated extension of the storage electrode 126 is disposed on the first gate electrode 155. The extension of the storage electrode 126 overlaps the first gate electrode 155 with the second gate insulating layer 160 interposed therebetween in the plan view to constitute a storage capacitor Cst. The extension of the storage electrode 126 serves as a first storage electrode E1 of the storage capacitor Cst (see FIG. 1), and the first gate electrode 155 serves as a second storage electrode E2 (see FIG. 1).

A gate electrode of the second transistor T2 may be a portion of the scan line 151. The data line 171 is connected to a first connector 51 through a contact hole 43. The first connector 51 is connected to the first electrode S2 of the second transistor T2 through a contact hole 42. The first electrode S2 and the second electrode D2 of the second transistor T2 may be disposed on the semiconductor layer 130.

The third transistor T3 may be disposed to include two transistors adjacent to each other as illustrated at a left side and a lower side with reference to a portion where the semiconductor layer 130 is folded in FIG. 11. Each of these two parts serves as the third transistor T3. A first electrode S3 of a first third transistor T3-1 in the left side is connected to a second electrode D3 of a second third transistor T3-2 in the lower side. A gate electrode of the two third transistors T3-1 and T3-2 may be a portion of the scan line 151 or a portion that protrudes upward from the scan line 151. Such a structure may be referred to as a dual-gate structure, and may prevent a leakage current from flowing. The first electrode S3 of the second third transistor T3-2 is connected to a first electrode S6 of the sixth transistor T6 and the second electrode D1 of the driving transistor T1.

The fourth transistor T4 is disposed at the portion where the previous-stage scan line 152 and the semiconductor layer 130 meet. A gate electrode of the second transistor T2 may be a portion of the previous-stage scan line 152. A first electrode S4 of a one fourth transistor T4 is connected to a second electrode D4 of the other fourth transistor T4. Such a structure may be referred to as a dual-gate structure, and may prevent a leakage current from flowing. The second electrode D4 of the fourth transistor T4 (i.e., the fourth transistor T4-1 at the left side) is connected to the second electrode D3 of the third transistor T3 through the semiconductor layer 130. The first electrode S4 of the fourth transistor T4-2 at the right side is connected to the initialization voltage line 127 through a contact hole 41.

A gate electrode of the fifth transistor T5 may be a portion of the light emission control line 153. The first electrode S5 of the fifth transistor T5 is connected to the second connector 52 through a contact hole 45. The second connector 52 is connected to the driving voltage line 172 through a contact hole 44. A second electrode D5 of the fifth transistor T5 is connected to the first electrode S1 of the driving transistor T1 through the semiconductor layer 130.

A gate electrode of the sixth transistor T6 may be a portion of the light emission control line 153. The third connector 50 is connected to a second electrode D6 of the sixth transistor T6 through a contact hole 47, and a first electrode S6 of the sixth transistor T6 is connected to the second electrode D1 of the driving transistor T1 through the semiconductor layer 130.

A gate electrode of the seventh transistor T7 may be a portion of the previous-stage scan line 152. The second electrode D7 of the seventh transistor T7 is connected to the second electrode D6 of the sixth transistor T6 through the semiconductor layer 130. The first electrode S7 of the seventh transistor T7 is connected to the initialization voltage line 127 through a contact hole 49.

The storage capacitor Cst includes a first storage electrode E1 and a second storage electrode E2 which overlap each other with a second gate insulating layer 160 interposed therebetween. The second storage electrode E2 may correspond to the first gate electrode 155 of the driving transistor T1, and the first storage electrode E1 may correspond to the extension of the storage electrode 126. Herein, the second gate insulating layer 160 serves as a dielectric material, and a capacitance of the storage capacitor Cst is determined by the electric charges cumulated in the storage capacitor Cst and a voltage between the first and second storage electrodes E1 and E2. It is possible to secure a space in which the storage capacitor Cst can be disposed in the space narrowed by the channel of the driving transistor T1 occupying a large area within the pixel by using the first gate electrode 155 as the second storage electrode E2.

The first storage electrode E1 is connected to a second connector 52 through a contact hole 46. Herein, the second connector 52 may be connected to the driving voltage line 172 through the contact hole 44, and a driving voltage ELVDD may be applied to the first storage electrode E1 by the second connector 52. Accordingly, the storage capacitor Cst stores a charge corresponding to a difference between the driving voltage ELVDD transferred to the first storage electrode E1 through the driving voltage line 172 and the gate voltage Vg of the first gate electrode 155.

A pixel electrode, which is referred to as an anode electrode, is connected to a third connector 50 through a contact hole 81.

The bridge electrode 31 overlaps the semiconductor layer 130 of the driving transistor T1, the first gate electrode 155, the storage electrode 126, the scan line 151, the second electrode D3 of the third transistor T3, and the upper gate connector 53. The bridge electrode 31 may be disposed to cross the scan line 151, and may be disposed in parallel with a portion of the data line 171. In addition, the bridge electrode 31 may be disposed to overlap the driving voltage line 172 in the plan view.

Specifically, the bridge electrode 31 is disposed so as to extend from a central portion of the Ω-type semiconductor layer 130 of the driving transistor T1 and through the second electrode D3 of the third transistor T3 in the second direction D2. A first end of the bridge electrode 31 extending through the second electrode D3 of the third transistor T3 may be disposed to be bent so as to not overlap the semiconductor layer 130.

The bridge electrode 31 is connected to the first gate electrode 155 through a contact hole 91.

The upper gate connector 53 is disposed to overlap one region of the bridge electrode 31. The upper gate connector 53 may extend from the second electrode D3 of the third transistor T3 in the second direction D2. The upper gate connector 53 may have a curved shape so as to overlap an obliquely curved shape of the bridge electrode 31.

The bridge electrode 31 and the upper gate connector 53 are connected through a contact hole 92. The second electrode D3 of the third transistor T3 (i.e., the drain region 130d3) and the upper gate connector 53 are connected through a contact hole 93.

As such, the bridge electrode 31 connects the first gate electrode 155 of the driving transistor T1 and the second electrode D3 of the third transistor T3 through the upper gate connector 53.

The invention is to prevent the crosstalk phenomenon, and it is thereby possible to provide an organic light emitting diode display in which the cross-talk phenomenon is reduced by forming the bridge electrode 31 at a lower portion of the buffer layer 120 to replace the gate driving connector or by forming a gate connector only in small regions.

Hereinafter, an organic light emitting diode display according to another exemplary embodiment in which the crosstalk phenomenon is reduced by including the bridge electrode 31 will be described following a stacking order with reference to FIG. 12.

FIG. 12 illustrates a cross-sectional view taken along line XII-XII' of FIG. 11.

Referring to FIG. 12, the organic light emitting diode display according to the exemplary embodiment uses a substrate 100 made of a flexible material such as plastic or polyimide ("PI"). A barrier layer 110 is disposed on the substrate 100, and a bridge electrode 31 made of a metal having conductivity or a semiconductor material having a similar conductive characteristic is disposed on the barrier layer 110. A buffer layer 120 is disposed on the bridge electrode 31. In an exemplary embodiment, the barrier layer 110 and the second buffer layer 120 may include an inorganic insulating material such as a silicon oxide, a silicon nitride, or an aluminum oxide.

A semiconductor layer 130 including a drain region 130d3 indicating the second electrode D3 of the third transistor T3 and a channel 130a1 of the driving transistor T1 is disposed on the buffer layer 120.

A first gate insulating layer 140 covering the semiconductor layer 130 is disposed on the semiconductor layer 130. The scan line 151 and the first gate electrode 155 of the driving transistor T1 are disposed on the first gate insulating layer 140. The scan line 151, the first gate electrode 155, the gate electrodes disposed on the transistors, and a lower gate connector 54 disposed on the first gate insulating layer 140 may be referred to as a first gate conductor.

A second gate insulating layer 160 covering the first gate conductor is disposed on the first gate conductor. In an exemplary embodiment, the first gate insulating layer 140 and the second gate insulating layer 160 may be made of a material such as a silicon nitride, a silicon oxide, and an aluminum oxide. The storage electrode 126 may be disposed on the second gate insulating layer 160, and the storage electrode 126, the initialization voltage line 127, etc. disposed on the second gate insulating layer 160 may be referred to as a second gate conductor.

A third gate insulating layer 170 covering the second gate conductor is disposed on the second gate conductor.

In an exemplary embodiment, the third gate insulating layer 170 may be made of a material such as a silicon nitride, a silicon oxide, and an aluminum oxide. The upper gate connector 53 may be disposed on the third gate insulating layer 170, and the upper gate connector 53, the first connector 51, the second connector 52, and the third connector 50 disposed on the third gate insulating layer 170 may be referred to as a third gate conductor.

Specifically, the upper gate connector 53 is disposed to overlap the drain region 130d3 of the third transistor T3 and the bridge electrode 31.

The first gate electrode 155 is connected to the bridge electrode 31 through the contact hole 91, and the upper gate connector 53 is connected to the bridge electrode 31 through the contact hole 92. In addition, the upper gate connector 53 is connected to the drain region 130d3 of the third transistor T3 through the contact hole 93.

In other words, the third transistor T3 may transfer the compensated voltage Dm+Vth to the gate electrode G1 of the driving transistor T1 and the second storage electrode E2 of the storage capacitor Cst through the upper gate connector 53 and the bridge electrode 31.

An interlayer-insulating layer 180 covering the third gate conductor is disposed on the third gate conductor. In an exemplary embodiment, the interlayer-insulating layer 180 may be made of a material such as a silicon nitride, a silicon oxide, and an aluminum oxide, and may be made of an organic insulating material. The driving voltage line 172 is disposed on the interlayer-insulating layer 180, and the data line 171 and driving voltage line 172 disposed on the interlayer-insulating layer 180 may be referred to as a data conductor.

The driving voltage line 172 may be disposed in a wide region so as to overlap the upper gate connector 53, the storage electrode 126, the first gate electrode 155, the scan line 151, the semiconductor layer 130, and the bridge electrode 31.

Although not shown in FIG. 12, a passivation layer (not illustrated) covering the driving voltage line 172 may be disposed on the driving voltage line 172. The passivation layer may include an organic insulating material. A pixel electrode (not illustrated) may be disposed on the passivation layer, and the pixel electrode may be connected to the data conductor through a contact hole disposed in the passivation layer. A barrier rib (not illustrated) may be disposed on the passivation layer and the pixel electrode. The barrier rib may have an open portion that overlaps the pixel electrode, and an organic light emitting layer may be disposed in the open portion. A common electrode (not illustrated) may be disposed on the organic emission layer and the barrier rib. The pixel electrode, the organic emission layer, and the common electrode constitute an organic light emitting diode OLED. When holes and electrons are injected from the pixel electrode and the common electrode into the organic emission layer in the organic light emitting diode OLED, excitons formed by combining the injected holes and electrons are emitted when they fall from an excited state to a ground state.

Hereinafter, a pixel of an organic light emitting diode display according to another exemplary embodiment in which a cross-talk phenomenon is reduced by including the lower gate connector 54 and the bridge electrode 31 disposed separately from the data line 171 to replace the driving connector will be described with reference to FIG. 13 and FIG. 14.

Figure 13:
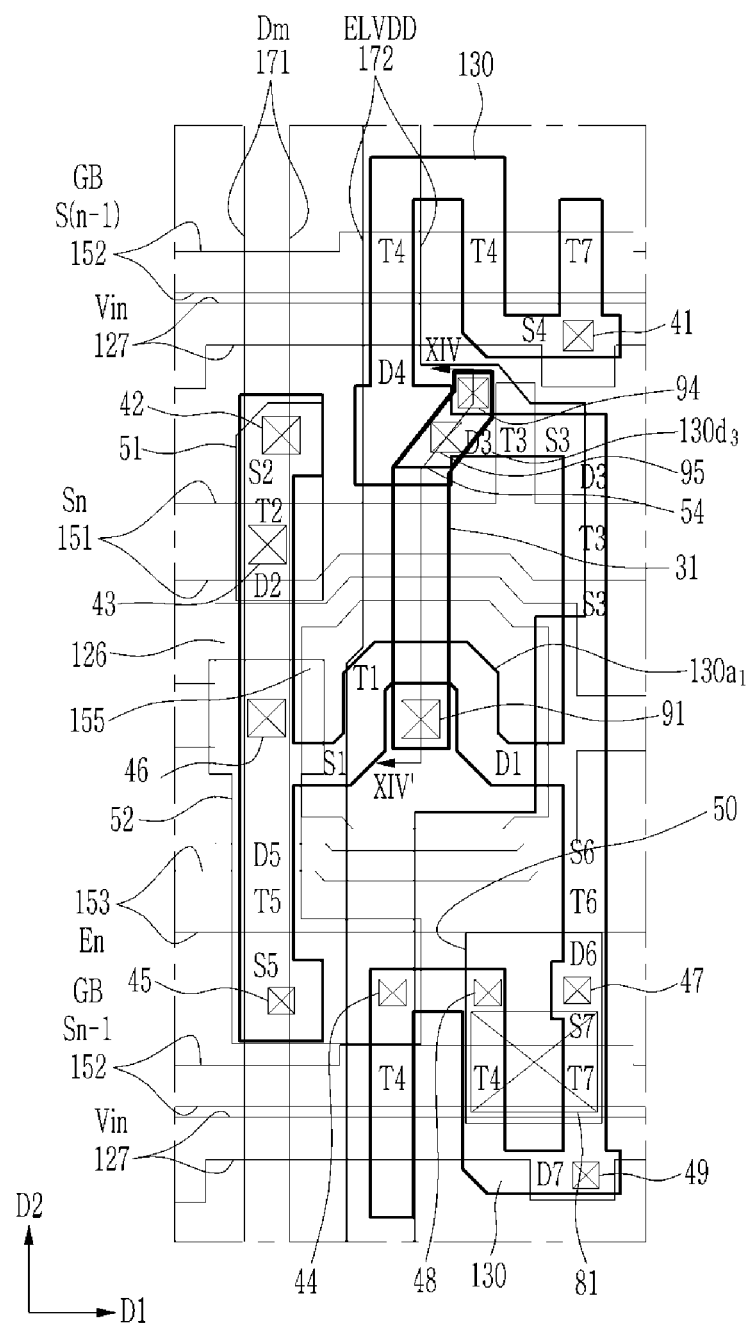
FIG. 13 illustrates a top plan view of another exemplary embodiment of a region including one pixel of an organic light emitting diode display according to the invention
Figure 14:
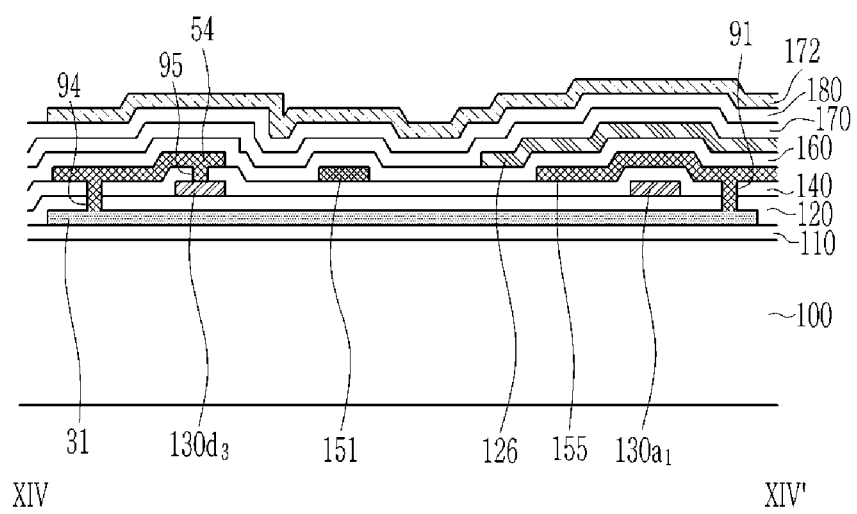
FIG. 14 illustrates a cross-sectional view taken along line XIV-XIV' of FIG. 13.

FIG. 13 illustrates a top plan view of another exemplary embodiment of a region including one pixel of an organic light emitting diode display according to the invention, and FIG. 14 illustrates a cross-sectional view taken along line XIV-XIV' of FIG. 13.

Referring to FIG. 13, the bridge electrode 31 is disposed so as to cross the scan line 151 and is disposed in parallel with the data line 171. In addition, the bridge electrode 31 may be disposed to overlap an extension of the driving voltage line 172.

The bridge electrode 31 is disposed so as to extend from a central portion of the Ω-type semiconductor layer 130 of the driving transistor T1 and through the second electrode D3 of the third transistor T3 in the second direction D2. The bridge electrode 31 overlaps the first gate electrode 155, the storage electrode 126, and a portion of the scan line 151, and a first end of the extended bridge electrode 31 may be bent. According to another exemplary embodiment, in the case that the semiconductor layer 130 is U-shaped, the bridge electrode 31 may be disposed to have a short length.

The lower gate connector 54 overlaps one region of the bridge electrode 31. The lower gate connector 54 may extend from second electrode D3 of third transistor T3 in the second direction D2. The lower gate connector 54 may have a curved shape so as to overlap an obliquely curved shape of the bridge electrode 31.

The bridge electrode 31 is connected to the first gate electrode 155 through a contact hole 91.

The bridge electrode 31 and the lower gate connector 54 are connected through a contact hole 94. The second electrode D3 of the third transistor T3 and the lower gate connector 54 are connected through a contact hole 95.

As such, the bridge electrode 31 connects the first gate electrode 155 of the driving transistor T1 and the drain region 130d3 of the third transistor T3 through the lower gate connector 54.

Hereinafter, a structure in which the bridge electrode 31 is connected to the first gate electrode 155 of the driving transistor T1 and the drain region 130d3 of the third transistor T3 will be described in detail with reference to a cross-sectional view of FIG. 14.

Referring to FIG. 14, the organic light emitting diode display according to another exemplary embodiment includes the bridge electrode 31 on the barrier layer 110. A buffer layer 120 is disposed on the bridge electrode 31 so as to cover the bridge electrode 31.

A semiconductor layer 130 including a drain region 130d3 indicating the second electrode D3 of the third transistor T3 and a channel 130a1 of the driving transistor T1 is disposed on the buffer layer 120.

A first gate insulating layer 140 covering the semiconductor layer 130 is disposed on the semiconductor layer 130.

The first gate electrode 155 of the driving transistor T1, the scan line 151, and the lower gate connector 54 are disposed on the first gate insulating layer 140.

The lower gate connector 54 is disposed to overlap the drain region 130d3 of the third transistor T3 and a partial region of the bridge electrode 31.

The lower gate connector 54 is connected to the drain region 130d3 of the third transistor T3 through the contact hole 95, and is connected to the bridge electrode 31 through the contact hole 94. In addition, the first gate electrode 155 is connected to the bridge electrode 31 through the contact hole 91.

In other words, the third transistor T3 may transfer the compensated voltage Dm+Vth to the gate electrode G1 of the driving transistor T1 and the second storage electrode E2 of the storage capacitor Cst through the lower gate connector 54 and the bridge electrode 31.

Hereinafter, a pixel of an organic light emitting diode display according to another exemplary embodiment in which a cross-talk phenomenon is reduced by including the upper and lower gate connectors 53 and 54 and the bridge electrode 31 disposed separately from the data line 171 to replace the driving connector will be described with reference to FIG. 15 and FIG. 16.

Figure 15:
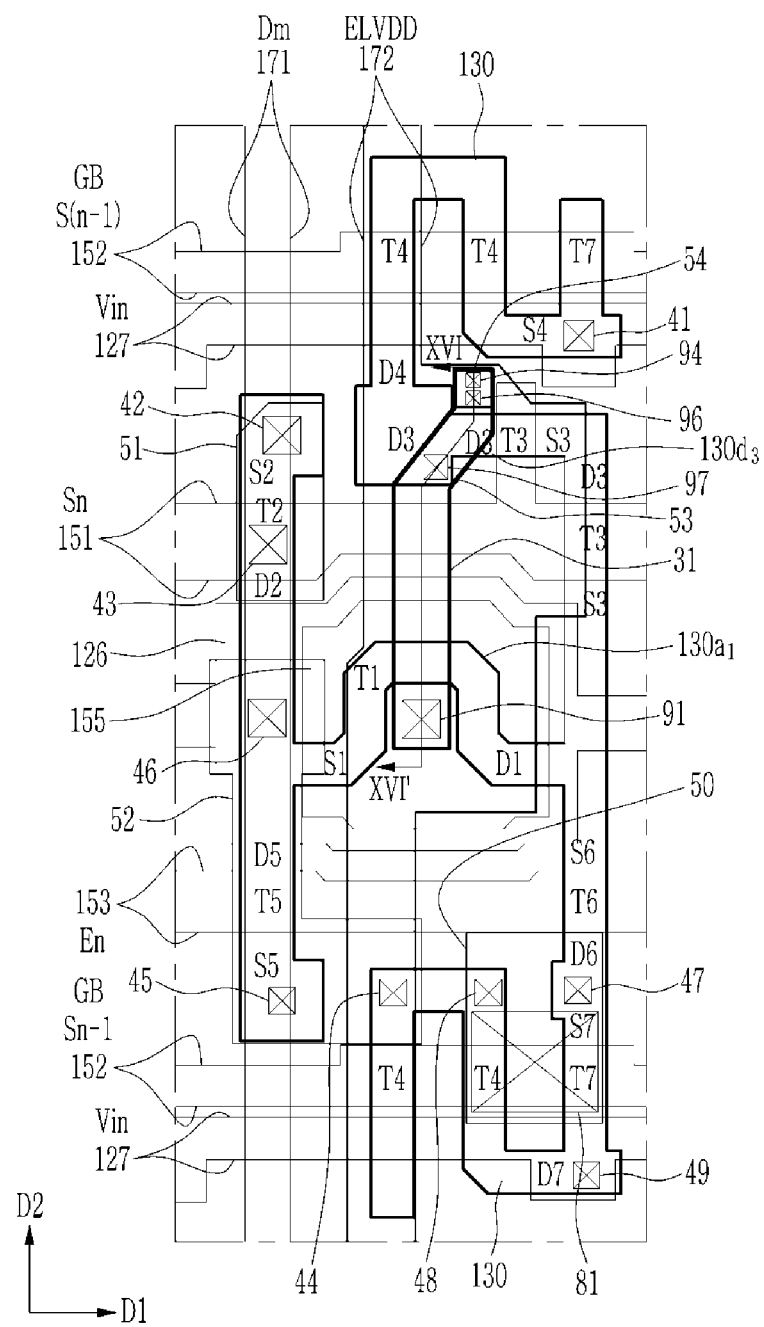
FIG. 15 illustrates a top plan view of still another exemplary embodiment of a region including one pixel of an organic light emitting diode display according to the invention.
Figure 16:
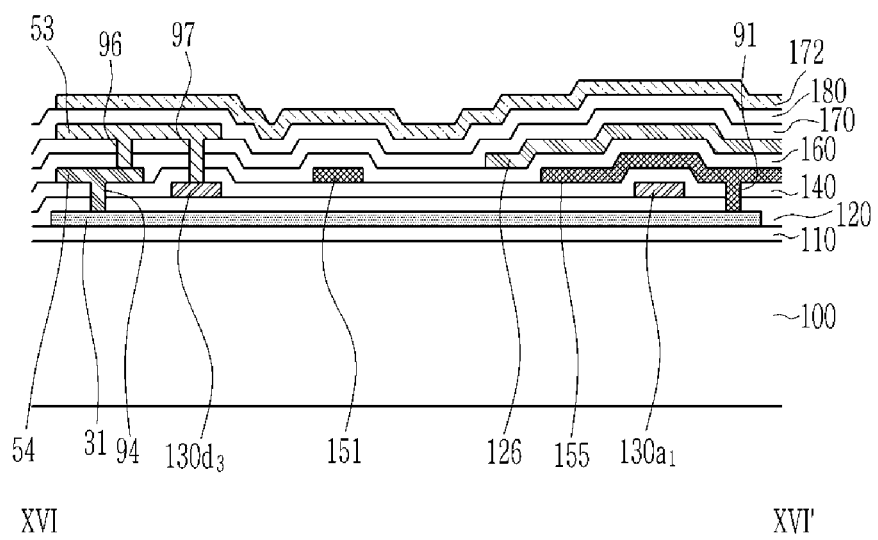
FIG. 16 illustrates a cross-sectional view taken along line XVI-XVI' of FIG. 15.

FIG. 15 illustrates a top plan view of still another exemplary embodiment of a region including one pixel of an organic light emitting diode display according to the invention, and FIG. 16 illustrates a cross-sectional view taken along line XVI-XVI' of FIG. 15.

Referring to FIG. 15, the bridge electrode 31 is disposed so as to cross the scan line 151 and is disposed in parallel with the data line 171. In addition, the bridge electrode 31 may be disposed to overlap an extension of the driving voltage line 172.

The bridge electrode 31 is disposed so as to extend from a central portion of the Ω-type semiconductor layer 130 of the driving transistor T1 and through the second electrode D3 of the third transistor T3 in the second direction D2. The bridge electrode 31 overlaps the first gate electrode 155, the storage electrode 126, and a portion of the scan line 151, and a first end of the extended bridge electrode 31 may be disposed to be bent so as to not overlap the semiconductor layer 130. According to another exemplary embodiment, if the semiconductor layer 130 is U-shaped, the bridge electrode 31 may be disposed to have a short length.

The upper gate connector 53 and the lower gate connector 54 overlap each other in one region of the bridge electrode 31.

The upper gate connector 53 overlaps the bridge electrode 31, a portion of the lower gate connector 54, and the drain region 130d3 of the third transistor T3.

The lower gate connector 54 overlaps a portion of the upper gate connector 53, and the first end of the bridge electrode 31, but does not overlap the semiconductor layer 130.

The bridge electrode 31 is connected to the first gate electrode 155 through the contact hole 91.

The upper gate connector 53 is connected to the lower gate connector 54 through a contact hole 96, and is connected to the drain region 130d3 through a contact hole 97.

The lower gate connector 54 is connected to the bridge electrode 31 through the contact hole 94.

As such, the bridge electrode 31 connects the first gate electrode 155 of the driving transistor T1 and the drain region 130d3 of the third transistor T3 through the upper and lower gate connectors 53 and 54.

Hereinafter, a structure in which the bridge electrode 31 is connected to the first gate electrode 155 of the driving transistor T1 and the drain region 130d3 of the third transistor T3 will be described in detail with reference to a cross-sectional view of FIG. 16.

Referring to FIG. 16, the organic light emitting diode display according to another exemplary embodiment includes the bridge electrode 31 on the barrier layer 110. A buffer layer 120 is disposed on the bridge electrode 31 so as to cover the bridge electrode 31.

A semiconductor layer 130 including a drain region 130d3 indicating the second electrode D3 of the third transistor T3 and a channel 130a1 of the driving transistor T1 is disposed on the buffer layer 120.

A first gate insulating layer 140 covering the semiconductor layer 130 is disposed on the semiconductor layer 130.

The first gate electrode 155 of the driving transistor T1, the scan line 151, and the lower gate connector 54 are disposed on the first gate insulating layer 140.

The lower gate connector 54 is disposed to overlap the drain region 130d3 of the third transistor T3 and the bridge electrode 31.

The upper gate connector 53 is disposed on the third gate insulating layer 170, and overlaps the lower gate connector 54, the drain region 130d3 of the third transistor T3, and the bridge electrode 31.

The upper gate connector 53 is connected to the drain region 130d3 of the third transistor T3 through the contact hole 97, and is connected to the lower gate connector 54 through the contact hole 96. In addition, the lower gate connector 54 is connected to the bridge electrode 31 through the contact hole 94, and the bridge electrode 31 is connected to the first gate electrode 155 through the contact hole 91.

In other words, the third transistor T3 may transfer the compensated voltage Dm+Vth to the gate electrode G1 of the driving transistor T1 and the second storage electrode E2 of the storage capacitor Cst through the upper gate connector 53, the lower gate connector 54, and the bridge electrode 31.

The organic light emitting diode display according to the present exemplary embodiment may connect the third transistor T3 and the driving transistor T1 even by using the upper gate connector 53 only at a short region, so as to reduce parasitic capacitance existing between the data line 171 and the upper gate connector 53.

In addition, since the data line 171 is disposed remotely from the bridge electrode 31 with the first, second, and third gate insulating layers 140, 160, and 170 and the first, second, and third gate conductors therebetween, a value of the parasitic capacitance existing between the data line 171 and the bridge electrode 31 becomes small. Accordingly, an influence of the voltage change of the data line 171 on the voltage of the driving gate node Q of the driving transistor T1 is reduced, and the driving current Id flowing through the organic light emitting diode OLED is constantly maintained, so that there is almost no change in the luminance of the organic light emitting diode display by the influence of the voltage change of the data line 171 on the voltage of the driving gate node Q of the driving transistor T1.

In the organic light emitting diode display according to the exemplary embodiment illustrated in FIG. 15 and FIG. 16, after forming the bridge electrode 31 at an upper portion of the barrier layer 110, the gate connector 54 may be disposed when the first gate conductor is disposed, and the driving connector may be disposed when the data conductor is disposed, and thus it is possible to provide an organic light emitting diode display in which the cross-talk is reduced without using an additional mask process.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

<Description of Symbols>

| | |
|---|---|
| 100: substrate | 110: barrier layer |
| 120: buffer layer | 126: storage electrode |
| 127: initialization voltage line | 130: semiconductor layer |
| 140: first gate insulating layer | 160: second gate insulating layer |
| 170: third gate insulating layer | 180: interlayer insulating layer |
| 151: scan line | 152: previous-stage scan line |
| 153: light emission control line | 155: first gate electrode |
| 156: gate connector | 158: bypass control line |
| 171: data line | 31: bridge electrode |
| 50, 51, 52: first, second, third connector | |

While this invention has been described in connection with what is presently considered to be practical exemplary embodiments, it is to be understood that the invention is not limited to the disclosed exemplary embodiments. On the contrary, it is intended to cover various modifications and equivalent arrangements included within the spirit and scope of the appended claims.

What is claimed is:

1. An organic light emitting diode display comprising:
a substrate;
a bridge electrode disposed on the substrate;
a buffer layer disposed on the bridge electrode;
a semiconductor layer disposed on the buffer layer;
a first gate insulating layer disposed on the semiconductor layer;
a first gate conductor disposed on the first gate insulating layer and which includes a first gate electrode;
a second gate insulating layer disposed on the first gate conductor;
a second gate conductor disposed on the second gate insulating layer;
an interlayer-insulating layer disposed on the second gate conductor; and
a data line disposed on the interlayer-insulating layer,
wherein the first gate electrode is directly connected to the bridge electrode through a fourth contact hole, the fourth contact hole is formed in the buffer layer and the first gate insulating layer and overlaps a portion of the first gate electrode disposed on the first gate insulating layer, the first gate electrode does not penetrate the second gate insulating layer,
the semiconductor layer is electrically connected to the bridge electrode, and
a capacitance exists between the data line and the bridge electrode.

2. The organic light emitting diode display of claim 1, wherein
the semiconductor layer includes a channel region of a driving transistor and a drain region of a third transistor,
the channel region of the driving transistor overlaps the first gate electrode, and
the drain region of the third transistor is electrically connected to the bridge electrode.

3. The organic light emitting diode display of claim 2, further comprising:
a first gate connector disposed on a same layer as the first gate electrode.

4. The organic light emitting diode display of claim 3, wherein
the first gate connector is physically connected to the bridge electrode through a first contact hole formed in the first gate insulating layer and the buffer layer, and is physically connected to the semiconductor layer through a second contact hole formed in the first gate insulating layer.

5. The organic light emitting diode display of claim 3, wherein
the second gate conductor includes a storage electrode, and
the storage electrode overlaps the first gate electrode with the second gate insulating layer interposed therebetween to constitute a storage capacitor.

6. The organic light emitting diode display of claim 3, further comprising:
a driving connector disposed on a same layer as the data line.

7. The organic light emitting diode display of claim 6, wherein
the first gate connector is physically connected to the bridge electrode through the first contact hole formed in the first gate insulating layer and the buffer layer, and is physically connected to the driving connector through a second contact hole formed in the second gate insulating layer and the interlayer-insulating layer, and
the driving connector is physically connected to the semiconductor layer through a third contact hole formed in the interlayer-insulating layer, the first gate insulating layer, and the second gate insulating layer.

8. The organic light emitting diode display of claim 1, further comprising:
a third gate insulating layer which covers the second gate conductor;
a third gate conductor disposed on the third gate insulating layer; and
a driving voltage line disposed on the interlayer-insulating layer,
wherein the driving voltage line is disposed to overlap the bridge electrode, and the interlayer-insulating layer covers the third gate conductor.

9. The organic light emitting diode display of claim 8, wherein
the semiconductor layer includes a channel region of the driving transistor and a drain region of the third transistor,
the channel region of the driving transistor overlaps the first gate electrode, and
the drain region of the third transistor is electrically connected to the bridge electrode.

10. The organic light emitting diode display of claim 9, wherein
the second gate conductor includes a storage electrode, and
the storage electrode overlaps the first gate electrode with the second gate insulating layer interposed therebetween to constitute a storage capacitor.

11. The organic light emitting diode display of claim 9, further comprising:
a lower gate connector disposed on a same layer as the first gate electrode.

12. The organic light emitting diode display of claim 11, wherein
the lower gate connector is physically connected to the bridge electrode through a first contact hole formed in the first gate insulating layer and the buffer layer, and is physically connected to the semiconductor layer through a second contact hole formed in the first gate insulating layer.

13. The organic light emitting diode display of claim 9, further comprising:
an upper gate connector disposed on a same layer as the third gate conductor.

14. The organic light emitting diode display of claim 13, wherein
the upper gate connector is physically connected to the semiconductor layer through a first contact hole formed in the first gate insulating layer, the second gate insulating layer, and the third gate insulating layer, and is physically connected to the bridge electrode through a second contact hole formed in the buffer layer, the first gate insulating layer, the second gate insulating layer, and the third gate insulating layer.

15. The organic light emitting diode display of claim 11, further comprising:
an upper gate connector disposed on a same layer as the third gate conductor, wherein
the lower gate connector is physically connected to the bridge electrode through a first contact hole formed in the buffer layer and the first gate insulating layer, and is physically connected to the upper gate connector through a second contact hole formed in the second gate insulating layer and the third gate insulating layer, and
the upper gate connector is physically connected to the semiconductor through a third contact hole formed in the first gate insulating layer, the second gate insulating layer, and the third gate insulating layer.

* * * * *